US012023850B2

(12) United States Patent
Taki et al.

(10) Patent No.: US 12,023,850 B2
(45) Date of Patent: Jul. 2, 2024

(54) POSITION DETECTION APPARATUS, IMPRINT APPARATUS, AND ARTICLE MANUFACTURING METHOD

(71) Applicant: CANON KABUSHIKI KAISHA, Tokyo (JP)

(72) Inventors: Tomokazu Taki, Tochigi (JP); Takafumi Miyaharu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/859,366

(22) Filed: Jul. 7, 2022

(65) Prior Publication Data

US 2023/0031701 A1    Feb. 2, 2023

(30) Foreign Application Priority Data

Jul. 28, 2021   (JP) .................. 2021-123566

(51) Int. Cl.
*B29C 59/00*   (2006.01)
*B29C 59/02*   (2006.01)
*B29C 37/00*   (2006.01)

(52) U.S. Cl.
CPC ............ *B29C 59/002* (2013.01); *B29C 59/02* (2013.01); *B29C 2037/906* (2013.01)

(58) Field of Classification Search
None
See application file for complete search history.

(56) References Cited

U.S. PATENT DOCUMENTS 9,283,720 B2    3/2016  Minoda et al.
2017/0329217 A1*  11/2017  Minoda ................. G03F 7/0002

FOREIGN PATENT DOCUMENTS

JP          5713961 B2     5/2015
JP       2018061061 A      4/2018

* cited by examiner

*Primary Examiner* — Robert J Grun
(74) *Attorney, Agent, or Firm* — ROSSI, KIMMS & McDOWELL LLP

(57) ABSTRACT

A position detection apparatus comprises an obtaining unit that obtains an image of a moiré that occurs due to first and second diffraction gratings overlapping; and a processor configured to perform a periodic analysis of a luminance distribution of the obtained image of the moiré, obtain a phase measurement value of the luminance distribution, and obtain a relative positioning between the first and second diffraction gratings, wherein the processor determines a phase shift amount for making the obtained phase measurement value be a value outside of a predetermined range including a discontinuous part of the phase, and performs a phase shift to shift the obtained phase measurement value by the determined phase shift amount, and obtains the relative positioning based on the phase-shifted phase measurement value.

12 Claims, 20 Drawing Sheets

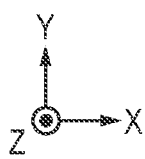

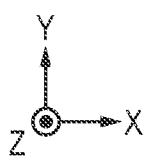
FIG. 7C 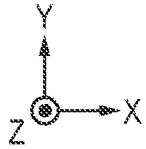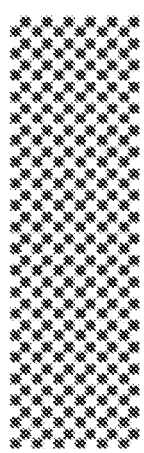
FIG. 7D 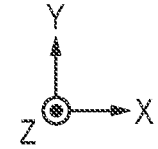

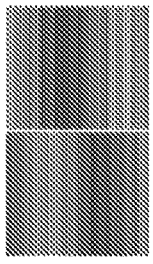
FIG. 13A
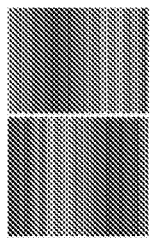
FIG. 13B
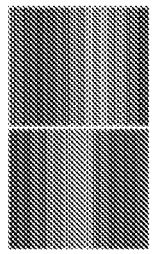
FIG. 13C
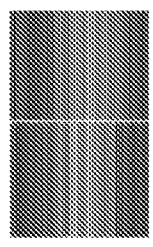
FIG. 13D
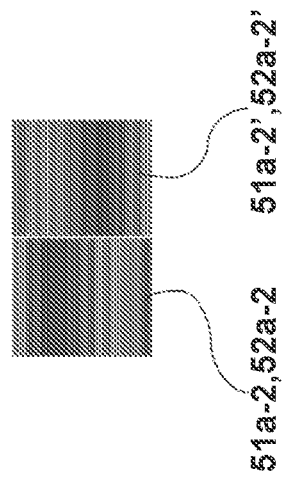
FIG. 13E
FIG. 13F
FIG. 13G 51a-2,52a-2  51a-2',52a-2'
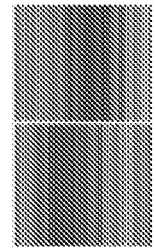
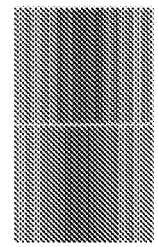
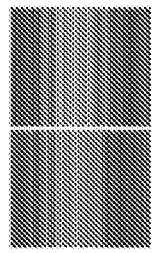
FIG. 13H
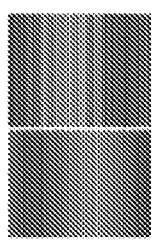
FIG. 13I
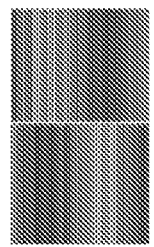
FIG. 13J

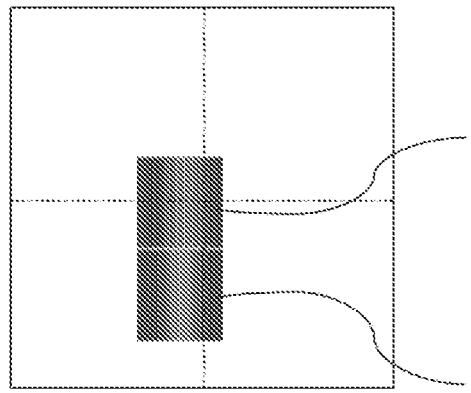
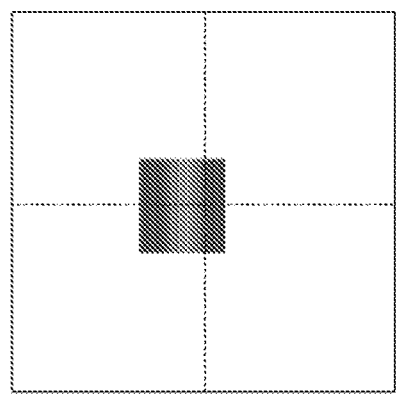
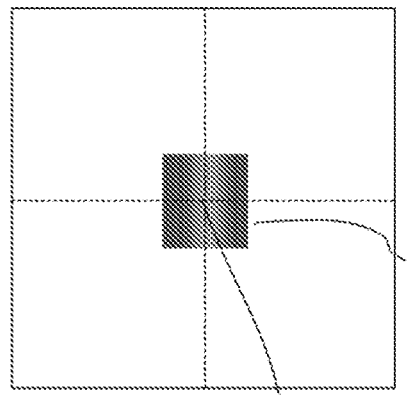

POSITION DETECTION APPARATUS, IMPRINT APPARATUS, AND ARTICLE MANUFACTURING METHOD

BACKGROUND OF THE INVENTION

Field of the Invention

The present invention relates to a position detection apparatus, an imprint apparatus, and an article manufacturing method.

Description of the Related Art

Imprinting technology is a technology which enables the transfer of minute nano-scale patterns, and is attracting attention as a lithography technology for mass production of devices such as semiconductor devices, liquid crystal display elements, and magnetic storage media. In imprint apparatuses that use imprinting technology, imprint material on substrates (silicon wafers and glass substrates) is molded using a mold in which fine patterns are formed.

In the imprint apparatus, the imprint material is cured in a state in which the mold and the imprint material on the substrate are in contact with each other, and then the mold is separated from the cured imprint material, thereby forming a concave/convex pattern composed of the imprint material on the substrate. A photocuring method in which the imprint material on the substrate is cured by irradiation with light such as ultraviolet rays may be employed as the method of curing the imprint material. In this case, the mold is made of a material which is transparent to light such as ultraviolet rays, for example, quartz.

In an imprint apparatus, it is necessary to precisely align the mold and the substrate when the mold and the imprint material on the substrate are brought into contact with each other. Recently, semiconductor process rules have come to be 100 nm or less, and the tolerance of the alignment error caused by the apparatus is low, only a few nm. Therefore, a die-by-die alignment method has been adopted as a method for alignment between a mold and a substrate (see Japanese Patent Laid-Open No. 2018-61061). A die-by-die alignment method is, for example, a method in which alignment between a mold and a substrate is performed by detecting an alignment mark provided in the shot region and an alignment mark provided in the mold, for each shot region on the substrate.

Further, one method for performing the alignment of a mold and a substrate is to determine, based on moiré patterns formed by diffraction of light with respect to the alignment mark of the mold and the substrate, the relative positioning between the mold and the substrate (see Japanese Patent No. 5713961). When this method is used, it is possible to obtain the relative positioning with high accuracy even if the resolution of the detection optical system is low, because moiré patterns can generate periodic waveforms with a large period.

In a mold manufacturing process, the circuit pattern and the alignment mark may be formed in different layers. In this case, when attempting to create an alignment mark in a mold manufacturing apparatus, depending on the alignment accuracy of the mold manufacturing apparatus, a deviation will occur in the positional relationship between the circuit pattern and the alignment mark as in the mold in FIG. 11B.

If there is no deviation in the positional relationship between the circuit pattern and the alignment mark, as in the mold in FIG. 11A, it is possible to transfer the circuit pattern without deviation when aligning the alignment marks to each other on the substrate side and the mold side. However, if there is a deviation in the positional relationship between the circuit pattern and the alignment mark, as in the mold in FIG. 11B, a deviation occurs between the circuit patterns when aligning the substrate-side and mold-side alignment marks to each other. There may also similarly be a deviation between the circuit patterns when aligning a substrate to which a circuit pattern was transferred by a mold with a deviation in the positional relationship between the circuit pattern and the alignment mark with a mold as shown in FIG. 11A.

Therefore, if there is a deviation in the positional relationship between the circuit pattern and the alignment mark in the mold or in the substrate, it is necessary to perform the imprint so that a deviation does not arise between circuit patterns rather than between the alignment marks, as in the imprinted state in FIG. 11B. Therefore, it is necessary to determine a relative positioning target between the alignment marks on the substrate side and the mold side.

Next, a case where the relative positioning between the alignment marks is obtained from moiré patterns will be considered. In this case, the target relative positioning may be a positioning corresponding to where the phase (unit: radians) of the moiré patterns switches from the maximum value to the minimum value (a pitch deviation). Also, due to manufacturing error in the alignment mark, distortion may occur in the waveform of the moiré patterns. Therefore, an error of several nm may occur between moiré patterns. Therefore, while the phase is continuous, error is negligibly small, but an error of several nm may occur in phases around a pitch deviation.

Therefore, when obtaining the relative positioning between the alignment marks from the phase of moiré patterns, depending on the target relative positioning, the error in the overlapping of the circuit patterns due to pitch deviation may be several nm.

SUMMARY OF THE INVENTION

The present invention provides a technique that is advantageous for improving the accuracy of position detection using moiré.

The present invention in its one aspect provides a position detection apparatus, comprising, an obtaining unit configured to obtain an image of a moiré that occurs due to a first diffraction grating having a grating pattern arranged in a first direction and a second diffraction grating having a grating pattern arranged in the first direction at a different pitch to the first diffraction grating overlapping, and a processor configured to perform a periodic analysis of a luminance distribution of the obtained image of the moiré, and, based on a result of the periodic analysis, obtain a phase measurement value of the luminance distribution, and based on the phase measurement value, obtain a relative positioning between the first diffraction grating and the second diffraction grating, wherein the processor is configured to determine a phase shift amount for making the obtained phase measurement value be a value outside of a predetermined range including a discontinuous part of the phase, and perform a phase shift to shift the obtained phase measurement value by the determined phase shift amount, and obtains the relative positioning based on the phase-shifted phase measurement value.

Further features of the present invention will become apparent from the following description of exemplary embodiments (with reference to the attached drawings).

BRIEF DESCRIPTION OF THE DRAWINGS

FIGS. 7A to 7D are views illustrating an example of a mark for detecting relative positioning in two directions (X and Y).

FIGS. 13A to 13J are views for illustrating an appearance of moiré patterns when a relative positioning between a mold and a substrate is changed slightly.

FIGS. 14A to 14C are views for describing advantages of a configuration using two moiré patterns.

DESCRIPTION OF THE EMBODIMENTS

Figure 1A:
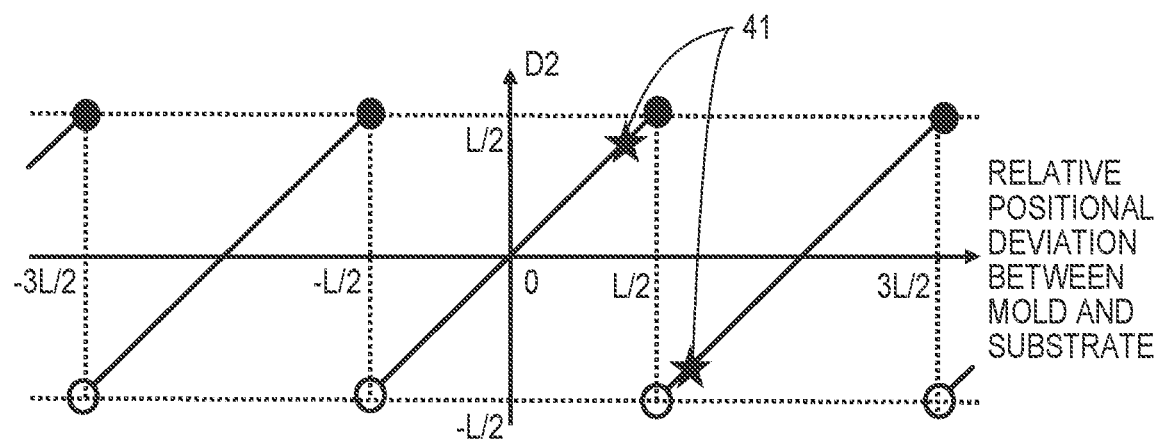
FIGS. 1A and 1B are views for describing pitch deviation of phase measurement values.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
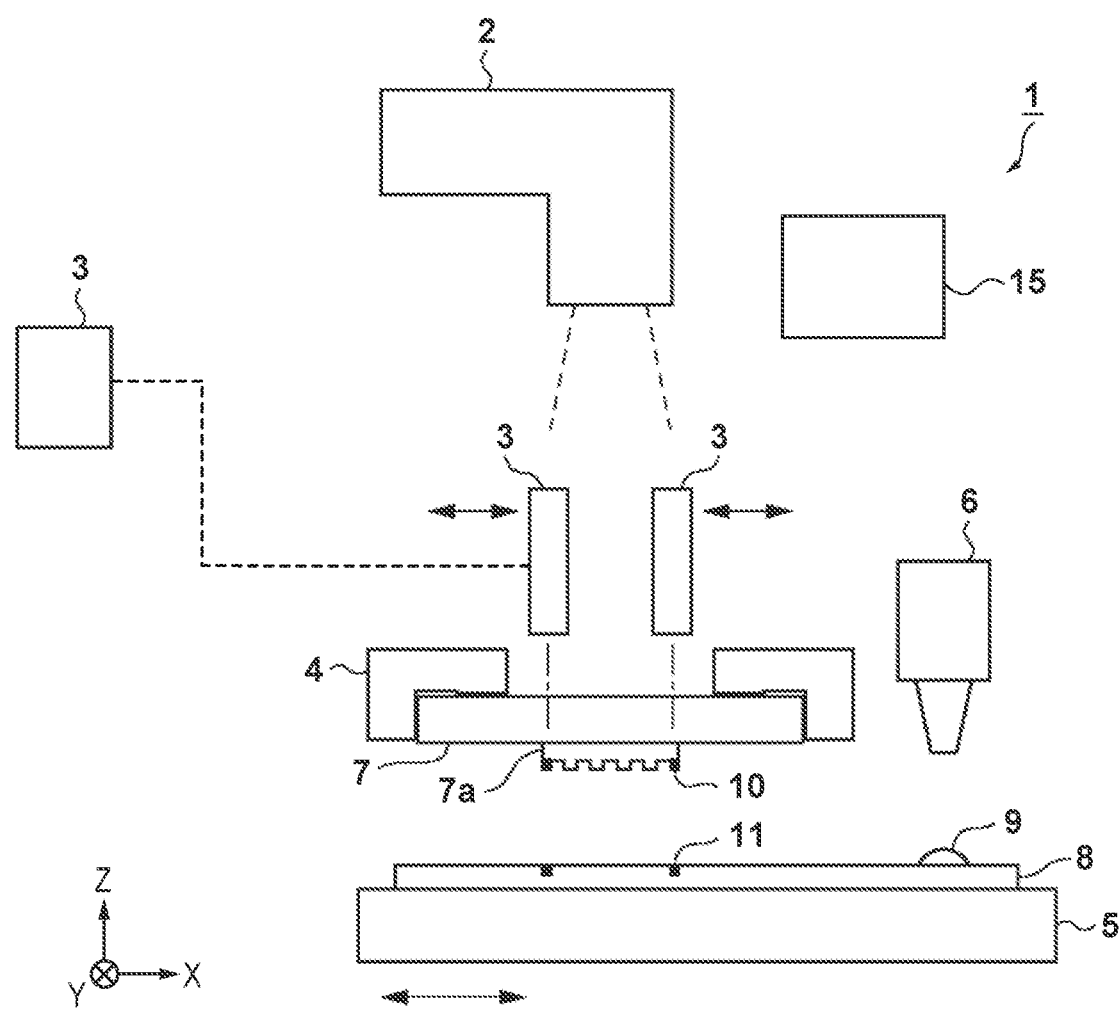
FIG. 2 is a view illustrating a configuration of an imprint apparatus.

FIG. 2 shows a configuration of an imprint apparatus 1 according to an embodiment of the present invention. In the imprint apparatus 1, a pattern region 7a of a mold 7 is brought into contact with an imprint material 9 disposed on the shot region of a substrate 8, and the imprint material is cured, thereby forming a pattern of a cured product of the imprint material 9 on the shot region.

A curable composition (sometimes referred to as a resin in an uncured state) which is cured by the application of energy for curing is used as the imprint material. As the energy for curing, electromagnetic waves, heat, or the like can be used. The electromagnetic waves can be, for example, light whose wavelength is selected from a range of 10 nm or more and 1 mm or less, for example, infrared rays, visible rays, ultraviolet rays, or the like. The curable composition may be a composition which is cured by irradiation with light or by heating. Of these, a photo-curable composition which is cured by irradiation of light contains at least a polymerizable compound and a photopolymerization initiator, and may further contain a non-polymerizable compound or a solvent if necessary. The non-polymerizable compound is at least one selected from the group of a sensitizer, a hydrogen donor, an internal mold release agent, a surfactant, an antioxidant, a polymer component, and the like. The imprint material may be disposed on a substrate in the form of droplets or an island or film of multiple connected droplets. The viscosity (a viscosity at 25° C.) of the imprint material may be, for example, 1 mPa s or more and 100 mPa s or less. As a material of the substrate, for example, glass, ceramic, metal, a semiconductor, a resin, and the like can be used. If necessary, a member made of a material different from that of the substrate may be provided on the surface of the substrate. The substrate is, for example, a silicon wafer, a compound semiconductor wafer, or quartz glass.

In this specification and the accompanying drawings, direction is shown in an XYZ coordinate system in which the XY plane is parallel to the surface of the substrate 8. Directions parallel to the X-axis, the Y-axis, and the Z-axis in the XYZ coordinate system are referred to as the X-direction, the Y-direction, and the Z-direction respectively, and rotation around the X-axis, rotation around the Y-axis, rotation around the Z-axis are referred to as θX, θY, θZ respectively. Control or driving with respect to the X-axis, Y-axis, and Z-axis means control or driving with respect to a direction parallel to the X-axis, a direction parallel to the Y-axis, and a direction parallel to the Z-axis, respectively. Also, control or driving with respect to the θ X-axis, the θ Y-axis, and the θ Z-axis means control or driving with respect to rotation around an axis parallel to the X-axis, rotation around an axis parallel to the Y-axis, and rotation around an axis parallel to the Z-axis respectively. Further, position is information that can be identified based on coordinates of the X-axis, the Y-axis, and the Z-axis, and orientation is information that can be identified by values of the θ X-axis, the θ Y-axis, and the θ Z-axis. Positioning means controlling position and/or orientation. Alignment may include control of the position and/or orientation of at least one of the substrate 8 and the mold 7.

The imprint apparatus 1 may include a curing device 2, a detection device 3, a mold driving mechanism 4, a substrate driving mechanism 5, a dispenser (imprint material supply unit) 6, and a controller 15. After a contact step of bringing the imprint material 9 and the mold 7 on the substrate 8 into contact with each other, the curing device 2 irradiates the imprint material with energy for curing the imprint material, thereby curing the imprint material. The curing device 2 may be, for example, a light source that generates light for curing the imprint material. The light source can be, for example, a high pressure mercury lamp, various excimer lamps, excimer lasers or light emitting diodes. The mold 7 has a pattern region 7a, and a pattern is formed in the pattern region 7a by concave portions. In a state in which the imprint material 9 on the substrate 8 and the pattern region 7a of the mold 7 are in contact with each other, the imprint material 9 may be filled in the concave portion of the pattern region 7a. The mold 7 may be comprised of a material that is transparent to light for curing the imprint material 9, for example, quartz.

The substrate driving mechanism 5 may be configured to hold the substrate 8, and drive the substrate 8 in relation to a plurality of axes (for example, three axes (X-axis, Y-axis, and θ Z-axis) or preferably six axes (X-axis, Y-axis, Z-axis, θ X-axis, θ Y-axis, and θ Z-axis). A mold driving mechanism 4 may be configured to hold the mold 7, and drive the mold 7 in relation to a plurality of axes (for example, three axes (Z-axis, θ X-axis, and θ Y-axis) or preferably six axes (X-axis, Y-axis, Z-axis, θ X-axis, θ Y-axis, and θ Z-axis). The substrate driving mechanism 5 and the mold driving mechanism 4 constitute a driving mechanism for driving at least one of the substrate 8 and the mold 7 so that the relative position between the substrate 8 and the mold 7 is adjusted. Adjustment of the relative position by the drive mechanism includes driving for bringing the mold 7 into contact with the imprint material on the substrate 8 and for separating the mold 7 from the cured imprint material (cured product pattern).

The detection device 3 (the position detection apparatus), in order to detect the relative position between the shot region of the substrate 8 and the mold 7, detects, as the position information, the relative position between the mold-side mark 10 disposed in the mold 7 and the substrate-side mark 11 disposed in the shot region of the substrate 8. Here, the substrate-side mark 11 and the mold-side mark 10 constitute a position information detection target. The substrate-side mark 11 and the mold-side mark 10 may include, for example, marks for forming moiré patterns. In this case, based on the moiré patterns, as the detection target position information, the relative positioning between the substrate-side mark 11 and the mold-side mark 10 can be detected by the detection device 3. Alternatively, the substrate-side mark 11 and the mold-side mark 10 may constitute a box in a box. In this case, as detection target position information, the position of substrate-side mark 11 and the position of the mold-side mark 10 can be detected by the detection device 3, respectively.

The detection device 3 includes an optical system for observing the marks, and the optical axis of the optical system may be arranged so as to be perpendicular to the surface of the substrate 8. The detection device 3 may be driven by a drive mechanism for positioning with respect to the X direction and the Y direction depending on the position of the mark to be detected. The detection device 3 may also be driven with respect to the Z direction for focus adjustment and may include an optical system for focus adjustment.

Based on the position information detected by the detection device 3, the controller 15 controls at least one of the substrate driving mechanism 5 and the mold driving mechanism 4 so that the shot region of the substrate 8 and the mold 7 are aligned. The imprint apparatus 1 may be provided with a deformation mechanism for deforming the mold 7 to match the shape of the shot region of the substrate 8 and the shape of the pattern region 7a of the mold 7. In this case, the controller 15, based on a plurality of position information detected by the detection device 3, may detect a shape difference between the shot region and the pattern region 7a, and control the deformation mechanism based on the shape difference.

The dispenser 6 places the imprint material 9 on the shot region of the substrate 8. The dispenser 6 may be configured to eject the imprint material 9 at a timing in accordance with a drop recipe while the substrate 8 is being driven by the substrate driving mechanism 5. The drop recipe is information (a map) indicating the arrangement of the imprint material 9 in the shot region. The dispenser 6 may be provided outside the imprint apparatus 1. In this case, the substrate 8 can be supplied to the imprint apparatus 1 in a state in which the imprint material 9 has been disposed on the substrate 8 by the dispenser 6.

The controller 15 controls the curing device 2, the detection device 3, the mold driving mechanism 4, the substrate driving mechanism 5, and the dispenser 6. The controller 15 may be configured by, for example, a PLD (Programmable Logic Device) such as an FPGA (Field Programmable Gate Array) or an ASIC (Application Specific Integrated Circuit, or a general-purpose computer in which programs are incorporated, or combinations of all or part of these. The controller 15 may include a memory for storing programs and data.

Hereinafter, imprint processing by the imprint apparatus 1 will be described. First, the substrate 8 is transported to a substrate holding portion of the substrate driving mechanism 5 (not shown) by a substrate conveyance mechanism (not shown), and is held by the substrate holding portion. Then, under the control of the controller 15, the substrate 8 is driven by the substrate driving mechanism 5 so that the shot region in which to form the pattern (imprint target) (hereinafter, simply referred to as "shot region") is disposed under the dispenser 6. The imprint material 9 is arranged on the shot region by the dispenser 6 while the substrate 8 is driven by the substrate driving mechanism 5.

Then, under control by the controller 15, the substrate 8 is driven by the substrate driving mechanism 5 so that the shot region is disposed under the mold 7. Then, under the control of the controller 15, at least one of the mold driving mechanism 4 and the substrate driving mechanism 5 is operated so that the imprint material 9 on the shot region and the pattern region 7a of the mold 7 come into contact.

Then, under control by the controller 15, position information (relative positioning) of the shot region of the substrate 8 and the pattern region 7a of the mold 7 is detected by the detection device 3, and the shot region and the pattern region 7a are aligned based on the position information. Alignment of the shot region and the pattern region 7a may be performed by at least one of the substrate driving mechanism 5 and the mold driving mechanism 4. At this time, based on the shape difference between the shot region and the pattern region 7a, the mold 7 may be deformed by the deformation mechanism.

Next, under the control of the controller 15, energy for curing is irradiated from the curing device 2 to the imprint material 9 via the mold 7 to thereby cure the imprint material 9. As a result, a pattern made of the cured product of the imprint material 9 is formed on the shot region. Then, under the control of the controller 15, at least one of the mold driving mechanism 4 and the substrate driving mechanism 5 is operated so that the cured product of the imprint material 9 on the shot region and the pattern region 7a of the mold 7 are separated.

Figure 3:
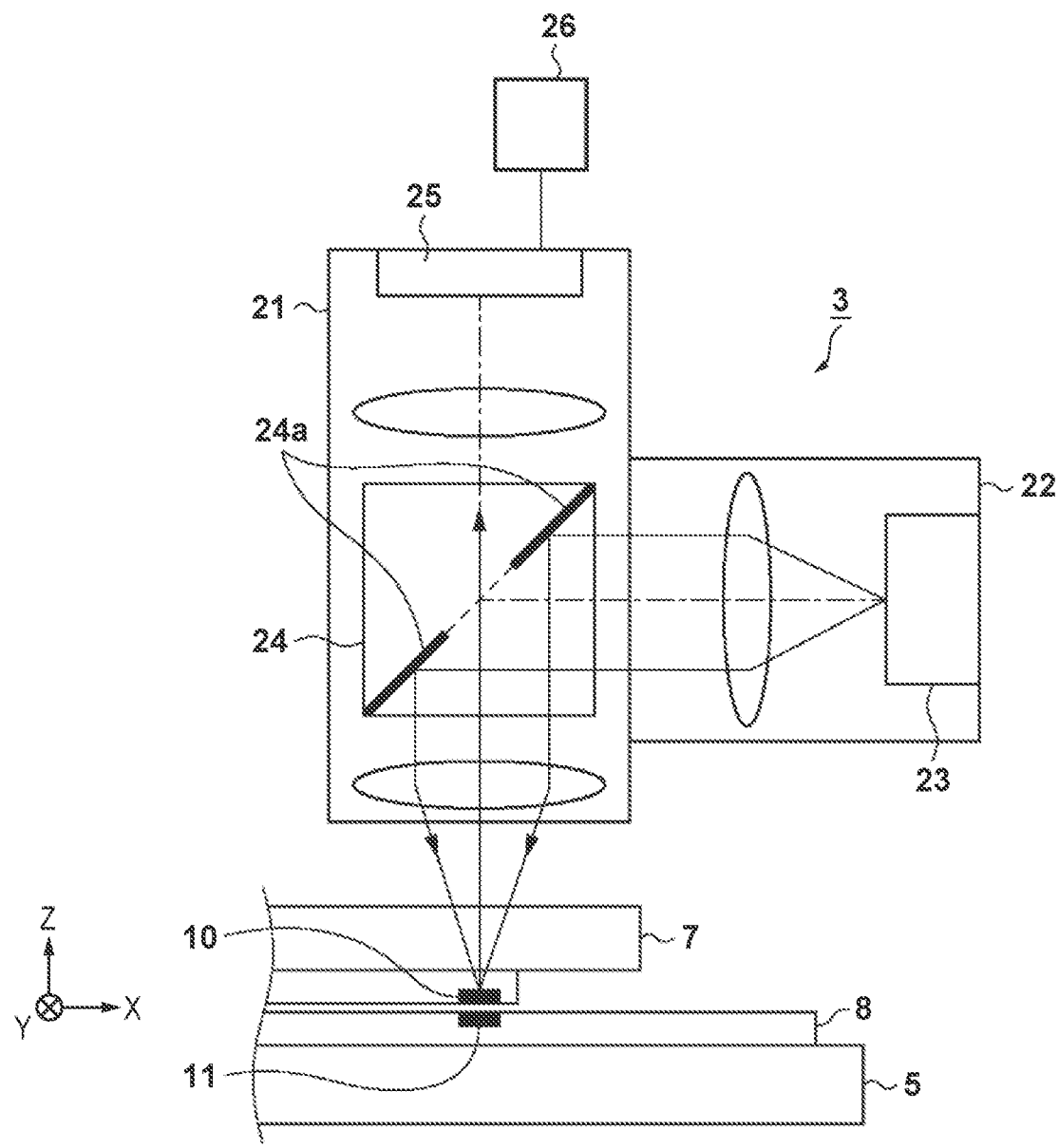
FIG. 3 is a view illustrating an example of a configuration of a detection device.

Hereinafter, the configuration of the detection device 3 will be exemplarily described. FIG. 3 shows a configuration example of the detection device 3. The detection device 3 may include a detection optical system 21 and an illumination optical system 22. The detection optical system 21 and the illumination optical system 22 may be configured to share a portion thereof. The illumination optical system 22 guides illumination light from a light source 23 to the same optical axis as the detection optical system 21 by an optical element such as a prism 24, to illuminate mold-side marks 10 and 11 with the illumination light. The light source 23 may include, for example, at least one of a halogen lamp, an LED, a semiconductor laser (LD), a high-pressure mercury lamp, a metal halide lamp, and a supercontinuum light source. As the illumination light, light of a wavelength that does not cure the imprint material 9 may be used.

The prism 24 may be located at or near a common pupil plane of the detection optical system 21 and the illumination optical system 22. The mold-side mark 10 and the substrate-side mark 11 may each be constituted by a diffraction grating. In the detection optical system 21, diffracted light from each of the mold-side mark 10 and the substrate-side mark 11, which are illuminated by the illumination optical system 22, interferes to form moiré patterns (interference fringes) on the imaging surface of an image capturing element 25. The image capturing element 25 can be, for example, a CCD or a CMOS image sensor. A processor 26 obtains the image data captured by the image capturing element 25, and processes the data. The processor 26 is, for example, a part of the controller 15 and obtains information of an image captured by the image capturing element 25, and calculates the relative positioning of the mold-side mark 10 and the substrate-side mark 11 by a calculation based on the image. The processor 26 may include a memory for storing programs and data.

Further, since the moiré pattern is formed by diffracted light from the mold-side mark 10 of the mold 7 and the diffracted light from the substrate-side mark 11 of the substrate 8, the amount of light of the moiré pattern may depend on the diffraction efficiency of the mold 7 and the substrate 8. In particular, since the diffraction efficiency varies periodically with respect to changes in wavelength, there are wavelengths for which a moiré pattern can be efficiently detected and wavelengths for which it is difficult to detect a moiré pattern. Light of a wavelength for which detection of a moiré pattern is difficult may become noise.

The prism 24 has a bonding surface, and a reflective film 24a for reflecting light of a periphery of a pupil surface of the illumination optical system 22 may be provided on the bonding surface. The reflective film 24a also functions as an aperture stop for defining the size of the pupil of the detection optical system 21 (or the detection NA: NAo). The prism 24 may be a half prism having a semi-transparent film on the bonding surface. Alternatively, instead of a prism, a plate-shaped optical element formed with a reflective film on the surface may be used. Alternatively, the periphery of the prism 24 in FIG. 3 may be configured to be a transmissive portion, the central portion to be a reflecting portion, and the position of the image capturing element 25 and the position of the light source 23 switched.

Figure 4:
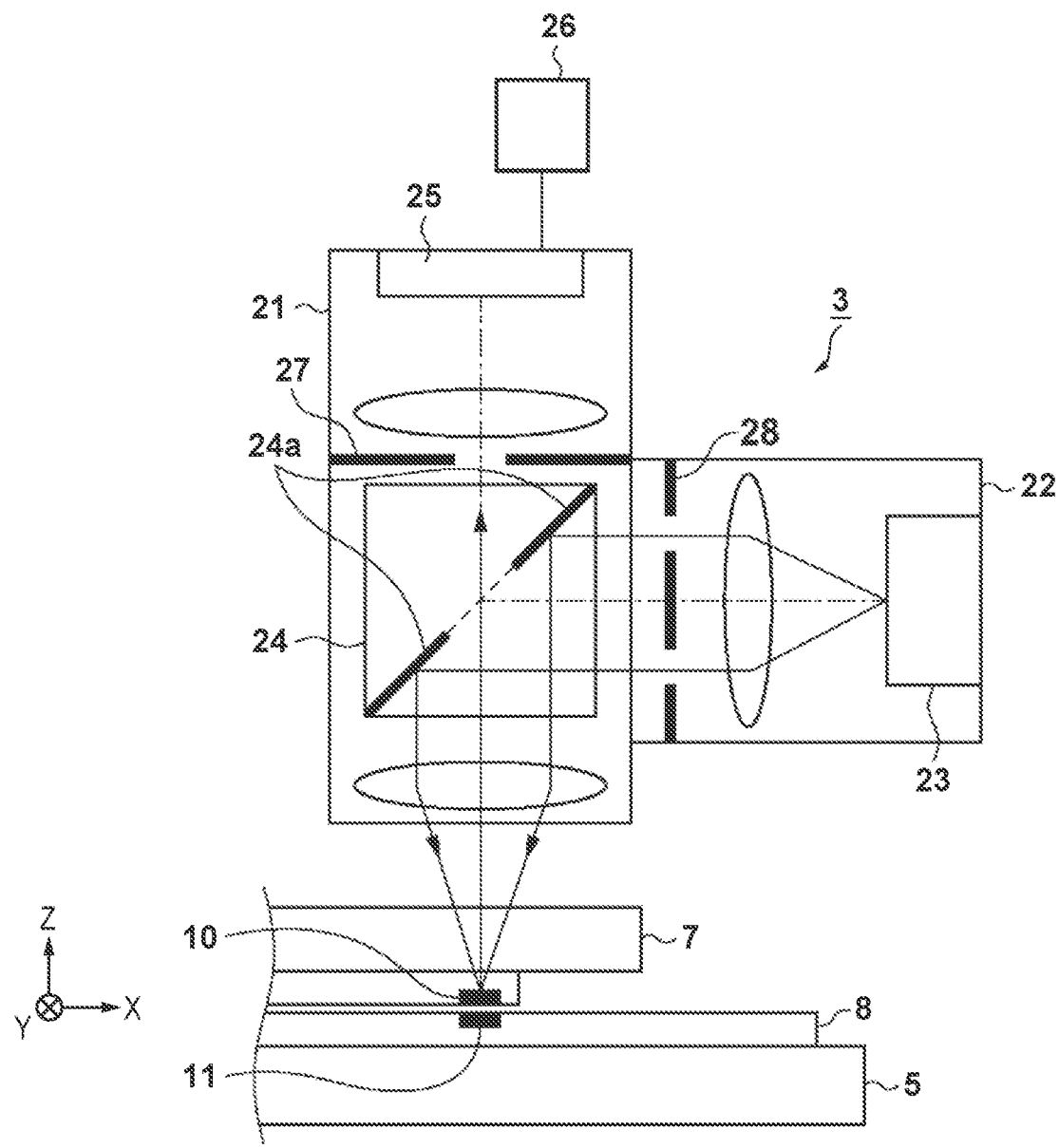
FIG. 4 is a view illustrating an example of another configuration of the detection device.

The position at which the prism 24 is arranged need not necessarily be a pupil plane shared by the detection optical system 21 and the illumination optical system 22 or in the vicinity thereof. For example, as illustrated in FIG. 4, the detection optical system 21 and the illumination optical system 22 may have individual aperture stops 27 and 28 in the respective pupil planes. The prism 24 may be a half prism having a semi-transparent film on the bonding surface, for example.

The light source 23 may be a semiconductor laser, but is not limited to a semiconductor laser, and may include an LED, and may include a halogen lamp, a metal halide lamp, a high-pressure mercury lamp, a sodium lamp, or the like.

The light source 23, in order to generate illumination light including a plurality of wavelengths, may include a lamp light source for generating a broad wavelength band light, a long-wavelength cutoff filter for blocking long wavelengths of the light that the lamp light source generated, and a short-wavelength cutoff filter for blocking short wavelengths of light that the lamp light source generated. Here, the long-wavelength cutoff filter and the short-wavelength cutoff filter may be filters in which the transmission band varies continuously depending on the incident position of the light.

Figure 5:
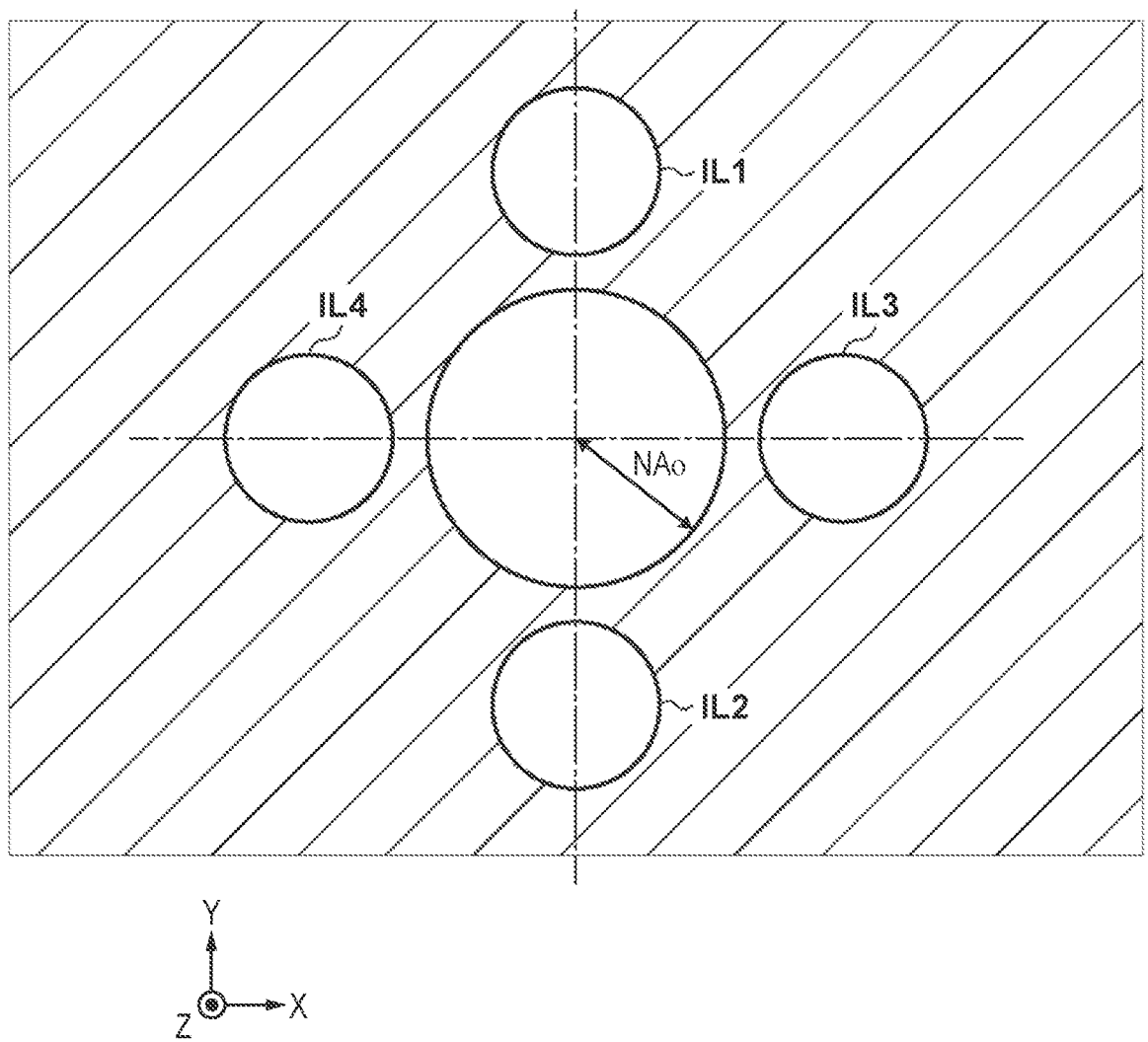
FIG. 5 is a view illustrating a relationship between a pupil intensity distribution of an illumination optical system and a numerical aperture of a detection optical system.

FIG. 5 exemplifies a relationship between the pupil intensity distribution of the illumination optical system 22 of the detection device 3 (IL1 to IL4) and the numerical aperture NAo of the detection optical system 21. The pupil intensity distribution of the illumination optical system 22 may include a first pole ILL a second pole IL2, a third pole IL3, and a fourth pole IL4. The illumination optical system 22 may illuminate the mold-side mark 10 and the substrate-side mark 11 by light incident perpendicularly to the direction in which the mold-side mark 10 and the pattern of the substrate-side mark 11 are arranged in the XY plane and light incident parallelly to that direction. By placing the reflecting film 24a which functions as an aperture stop in the pupil plane of the illumination optical system 22, and shielding unwanted light, a plurality of poles (i.e., the first pole IL1 to the fourth pole IL4) can be formed from a single light source 23.

Hereinafter, referring to FIGS. 6A to 6D, the principle of generation of moiré patterns by diffracted light from the mold-side mark 10 and the substrate-side mark 11, and the detection of the relative positioning between the mold-side mark 10 (mold 7) and the substrate-side mark 11 (the shot region of the substrate 8) using the moiré patterns will be described.

In the present embodiment, the mold-side mark 10 disposed in the mold 7 has a first diffraction grating including a grating pattern arranged, for example, in the X direction (first direction). Further, the substrate-side mark 11 disposed on the substrate 8 has a second diffraction grating including a grating pattern arranged in the first direction at a different pitch (the period at which the grating pattern is formed) from the first diffraction grating. The processor 26 may function as an obtaining unit for obtaining a moiré image occurring due to the first diffraction grating and the second diffraction grating overlapping. The processor 26 performs a periodic analysis of the luminance distribution of the obtained image of the moiré, and, based on the result of the periodic analysis, obtains a luminance distribution phase measurement value, and based on the phase measurement value, determines the relative positioning between the first diffraction grating and the second diffraction grating.

Figure 6A:
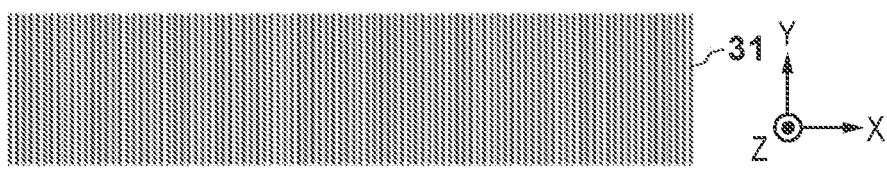
FIGS. 6A to 6D are views for describing a principle for detecting the relative position between diffraction gratings using moiré.
Figure 6B:
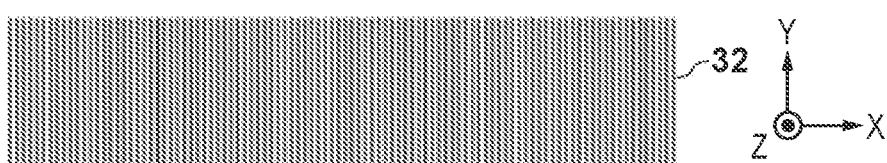

As illustrated in FIGS. 6A and 6B, the periods of the patterns (gratings) of the diffraction grating 31 provided in the mold 7 as the mold-side mark 10 (first diffraction grating) and the diffraction grating 32 provided on the substrate 8 as the substrate-side mark 11 (second diffraction grating) slightly differ in the detection direction. When two diffraction gratings whose grating periods are different from each other are overlapped, a moiré pattern, which is a pattern with a period reflecting the difference in the periods between the diffraction gratings appears due to the interference in the diffracted light from each of the two diffraction gratings. Since the phase of the moiré pattern differs depending on the relative positioning of the diffraction gratings to each other, the relative positioning of the mold-side mark 10 and the substrate-side mark 11, specifically the relative positioning between the mold 7 and the substrate 8 (shot region) can be obtained by detecting the moiré pattern.

Figure 6C:
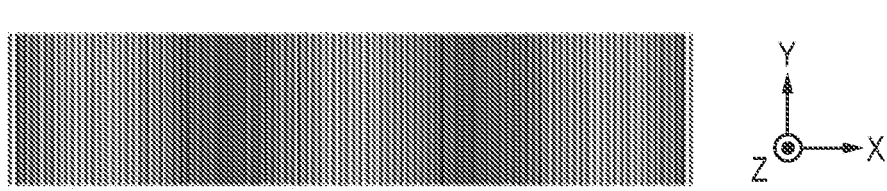
Figure 6D:
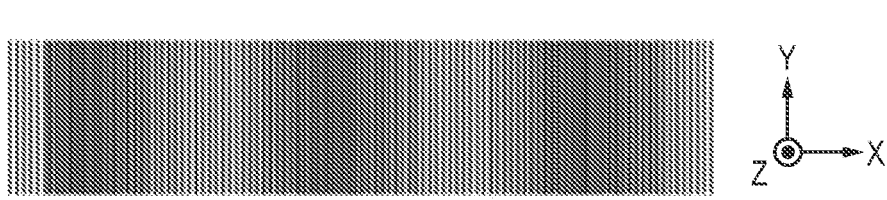

Specifically, when the diffraction grating 31 and the diffraction grating 32, which have slightly different periods, overlap, diffracted light from each of the diffraction gratings 31 and 32 overlaps, and thereby, a moiré pattern having a period reflecting the difference in their periods occurs as illustrated in FIG. 6C. The positioning of light and dark (phases) in the moiré pattern changes depending on the relative position between the diffraction grating 31 and the diffraction grating 32. For example, if one of the diffraction gratings 31 and 32 deviates in the X-direction, the moiré pattern exemplified in FIG. 6C may change as illustrated in FIG. 6D. Because the moiré pattern enlarges the amount of position deviation between the diffraction grating 31 and the diffraction grating 32 and occurs as fringes of a larger period, even if the resolution of the detection optical system 21 is low, it will be possible to detect the relative position between the diffraction grating 31 and the diffraction grating 32 with high accuracy. The magnification of the enlargement of the position deviation amount defines the moiré magnification.

In a case of detecting the diffraction gratings 31 and 32 in a bright field (illuminating the diffraction gratings 31 and 32 from the vertical direction and detecting the light diffracted in the vertical direction by the diffraction gratings 31 and 32) in order to detect a moiré pattern, the detection optical system 21 may also end up detecting zero-order light from the diffraction gratings 31 and 32. The zero-order light is a factor that lowers the contrast of the moiré pattern. Therefore, it is desirable to have a configuration of a dark field where the detection device 3 does not detect zero-order light (in other words, the diffraction gratings 31 and 32 are illuminated at an oblique incidence).

Figure 7A:
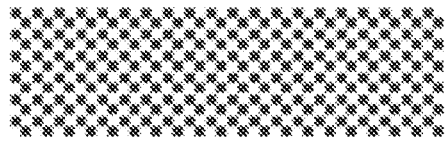
Figure 7B:
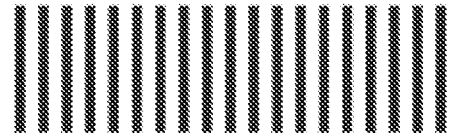

In order to detect the moiré pattern even in a dark field configuration, one of the diffraction gratings 31 and 32 may be a checkerboard-shaped diffraction grating as shown in FIG. 7A and the other diffraction grating may be a diffraction grating as shown in FIG. 7B. The diffraction grating illustrated in FIG. 7B includes a pattern periodically arranged in the detection direction, and a pattern periodically arranged in a direction perpendicular to the detection direction.

With the configurations of FIG. 5, FIG. 7A, and FIG. 7B, light from the first pole IL1 and the second pole IL2 is incident on the diffraction gratings, and is diffracted in the Y direction and also is diffracted in the X direction by the checkerboard-shaped diffraction grating. Furthermore, the light diffracted in the X direction by the diffraction grating which has a slightly different period contains relative positioning information in the X direction, and is incident in the detection region (NAo) on the pupil of the detection optical system 21 and detected by the image capturing element 25. This can be used to obtain the relative positioning of the two diffraction gratings.

Figure 8:
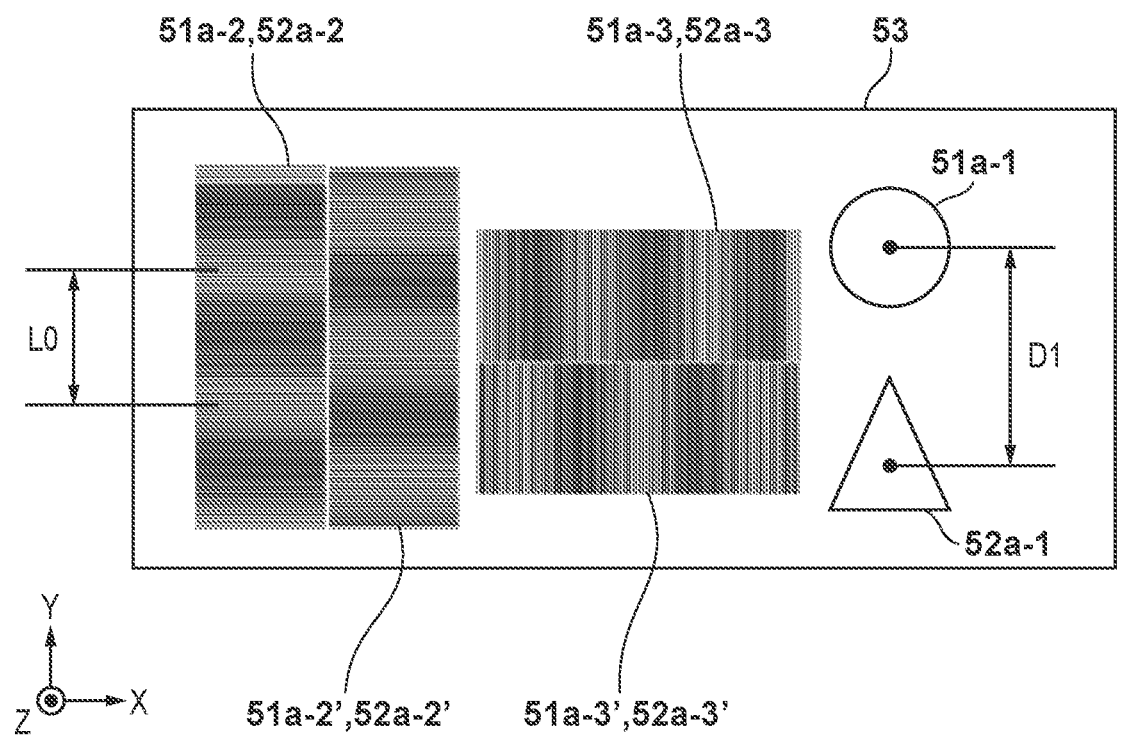
FIG. 8 is a view illustrating a configuration of an arrangement of a plurality of marks.

FIG. 8 schematically shows the marks as observed when the mold 7 and the substrate 8 are overlapped with each other. A range 53 of an outer frame is a range that can be observed by the detection device 3 all at once. The range 53 includes a first mark 51a-1 for rough alignment on the mold side, and a second mark 52a-1 for rough alignment on the substrate side. The processor 26 performs rough position detection of the mold and the substrate on the basis of the image of the first mark 51a-1 and the image of the second mark 52a-1 in the image. The controller 15 may perform rough alignment of the mold and the substrate based on the result of the rough position detection. The controller 15 may perform a fine alignment of the mold and the substrate as described later after the rough alignment.

For example, the processor 26 may obtain a relative positional deviation D1 between the shot region of the substrate 8 and the mold 7, with a geometric center position of the first mark 51a-1 for rough alignment on the mold side and the second mark 52a-1 for rough alignment on the substrate side as a reference. Since the first mark 51a-1 on the mold side and the second mark 52a-1 on the substrate side can be miniaturized, rough alignment using small marks of an exclusive region becomes possible thereby. Here, the intensity ratio in the image of the detected marks depends on the difference in reflectance of the first mark 51a-1 on the mold side and the second mark 52a-1 on the substrate side. When the intensity ratio is large, the strong intensity mark image is saturated, resulting in a detection error. Therefore, it is necessary to suppress the intensity ratio of the image of the marks.

Next, a moiré pattern formed by the mark 51a-2 of the mold 7 and the mark 52a-2 of the substrate 8 will be described. Mark 51a-2 and mark 52a-2 are configured by a first diffraction grating and a second diffraction grating having periodic patterns shown in FIG. 7C or 7D, and since their periods in the measurement direction are slightly different from each other, a moiré pattern is formed in the Y direction when they are overlapped. Further, the direction in which the moiré pattern shifts when the relative positioning changes differs depending on the difference between the period of the mark 51a-2 and the period of the mark 52a-2. For example, if the period of the mark 51a-2 of the mold 7 is slightly larger than the period of the mark 52a-2 of the substrate 8, when the substrate 8 is relatively shifted in the +Y direction, the phase of the moiré patterns also shifts in the +Y direction. Conversely, if the period of the mark 51a-2 of the mold 7 is slightly smaller than the period of the mark 52a-2 of the substrate 8, when the substrate 8 is relatively shifted in the +Y direction, the phase of the moiré patterns shifts in the −Y direction.

Next, a moiré pattern formed by the mark 51a-2 of the mold 7 and the mark 52a-2 of the substrate 8 will be described. The mark 51a-2' (third diffraction grating) of the mold 7 and the mark 52a-2' (fourth diffraction grating) of the substrate 8 are obtained by swapping the periods in the measurement direction of the mark 51a-2 of the mold 7 and the mark 52a-2 of the substrate 8. Therefore, when the relative position changes, the positions of the left moiré pattern and the right moiré pattern change in opposite directions. For example, FIGS. 13A to 13J are views for illustrating the change in moiré patterns when the relative positioning between the mold 7 and the substrate 8 changes slightly. The same moiré patterns are repeatedly illustrated starting with FIG. 13A and progressively deviating slightly therefrom up to FIG. 13J.

Further, in FIG. 8, the shift in the X direction is detected using the moiré pattern formed by the mark 51a-3 of the mold 7 and the mark 52a-3 of the substrate 8, and the moiré pattern formed by the mark 51a-3' of the mold 7 and the mark 52a-3' of the substrate 8. The principle is the same as that of the above described detection of the shift in the Y direction using the moiré pattern formed by the mark 51a-2 of the mold 7 and the mark 52a-2' of the substrate 8, and the moiré pattern formed by the mark 51*a*-2' of the mold 7 and the mark 52*a*-2' of the substrate 8 in FIG. 8.

For each moiré pattern, it is possible to calculate the phase by using arctan after performing a discrete Fourier transform including a fast Fourier transform. Specifically, when the frequency is w, the frequency function F(ω) obtained by the discrete Fourier transform is constituted by a real part and an imaginary part, and is expressed by the following equation.

$$F(\omega) = \text{Real } F(\omega) + i\text{Imaginary } F(\omega)$$

where i represents an imaginary number.

The phase of F(ω) is obtained by the following equation.

$$\arctan(\text{Imaginary } F(\omega)/\text{Real } F(\omega))$$

For example, in the cases of FIGS. 13A to 13J, since the moiré patterns are single period waveforms, the phase of the moiré patterns can be obtained by the following equation.

$$\arctan(\text{Imaginary } F(1)/\text{Real } F(1))$$

In this manner, the phase of the left moiré pattern and the phase of the right moiré pattern are obtained. When the obtained phases are phase A and phase B, respectively, the two moiré patterns change in opposite directions to each other, so that the phase measurement value P is expressed by the following equation.

$$\text{Phase measurement value } P: (\text{Phase } A - \text{Phase } B)/2$$

Assuming that the state of FIG. 13E is just before a pitch deviation, the phase A is about +π, the phase B is about −π, and the phase measurement value P is about π. Further, in the case of FIG. 13A and FIG. 13J, the phase A is about 0, the phase B is about 0, the phase measurement value P is about 0.

In the present embodiment, configuration is such that two moiré patterns are used, but configuration may be such that only one moiré pattern is used. Here, referring to FIGS. 14A to 14C, advantages of a configuration using two moiré patterns will be described. FIG. 14A illustrates a configuration in which only one moiré pattern is used. Here, the moiré pattern is arranged at a center position 54 of the image processing without deviation therefrom. In contrast, FIG. 14B illustrates an example in which a moiré pattern deviates from the center position 54 of the image processing. As shown in FIG. 14B, when the moiré pattern deviates from the center position 54 of the image processing, a measurement error occurs. For example, the phase measurement value P in FIG. 14A: phase of the moiré pattern, and the phase measurement value P in FIG. 14B: phase of the moiré pattern+deviation from the center position 54 of the image processing; therefore, a measurement error occurs between the phase measurement value P of FIG. 14A and the phase measurement value P of FIG. 14B.

On the other hand, when two moiré patterns are used as shown in FIG. 14C, the phase measurement value *P* in FIG. 14C:
{(phase *A*+deviation from the center position 54 of the image processing)−(phase *B*+deviation from the center position 54 of the image processing)}/2=(phase *A*−phase *B*)/2

This makes it possible to cancel out the deviation from the center position 54 of the image processing. Thus, a configuration using two moiré patterns is advantageous in that it is robust to deviations from the center position 54 of the image processing.

In addition, for the length L0 of one period of the moiré patterns in FIG. 8, L: L0×moiré magnification and therefore the length L obtained by converting one period of the moiré pattern into the apparatus coordinate system can be obtained.

Figure 9A:
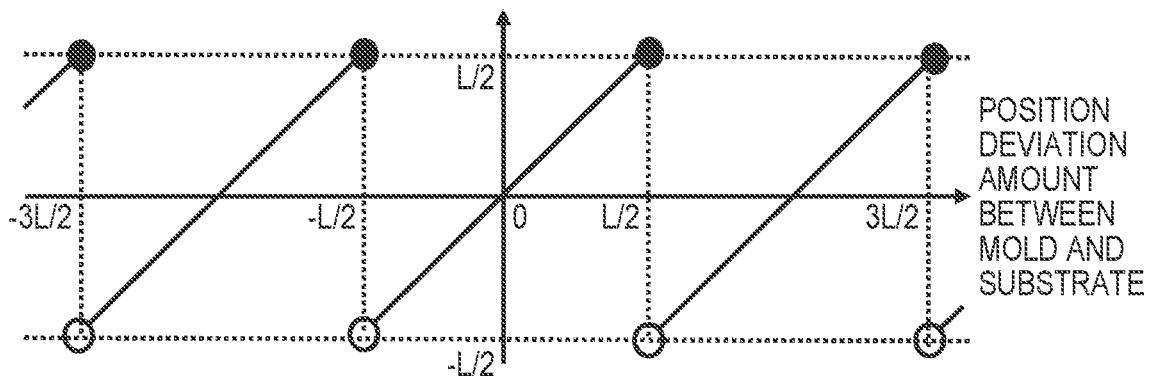
FIGS. 9A and 9B are views for describing pitch deviation of phase measurement values.

The measurement value D2 of the moiré pattern can be obtained from the product of the length L and the phase measurement value P. Since the range of the phase A and the phase B can only be from −π to +π, the range of D2 can also only be taken from −L/2 to +L/2 as shown in FIG. 9A. Therefore, if the phase measurement value P deviates so as not to fall within the range from −π to +π, i.e., if it is a pitch deviation, it is impossible to determine how many periods the pitch deviation is only with the phases A and B of the moiré patterns. In this case, it is impossible to obtain the relative positional deviation between the mold 7 and the substrate 8 correctly.

Also, without using the phase measurement value P, moiré pattern measurement value D2A: length L×phase A, and moiré pattern measurement value D2B: length L×phase B, and it is possible to obtain the measurement value D2 of the moiré pattern by calculating (D2A−D2B)/2. In consideration of the phase shift processing described later, it is desirable to use the measurement value D2 of the moiré patterns by these methods.

Meanwhile, it is possible to determine how many periods the pitch deviation is from a value obtained by converting the relative positional deviation D1 of the mold-side mark 51*a*-1 and the substrate-side mark 52*a*-1 as in FIG. 8 to the apparatus coordinate system and from the length L. Therefore, if both the moiré patterns and mold-side marks for rough alignment such as the mold-side mark 51*a*-1 and the substrate-side mark 52*a*-1 are used, relative positional deviation between the mold 7 and the substrate 8: pitch deviation periods×L+D2, and it is possible to obtain the relative positional deviation between the mold 7 and the shot region of the substrate 8 with high accuracy. For example, if the pitch deviation is by −1 period, the relative positional deviation between the mold 7 and the substrate 8: −L+D2.

Figure 9B:
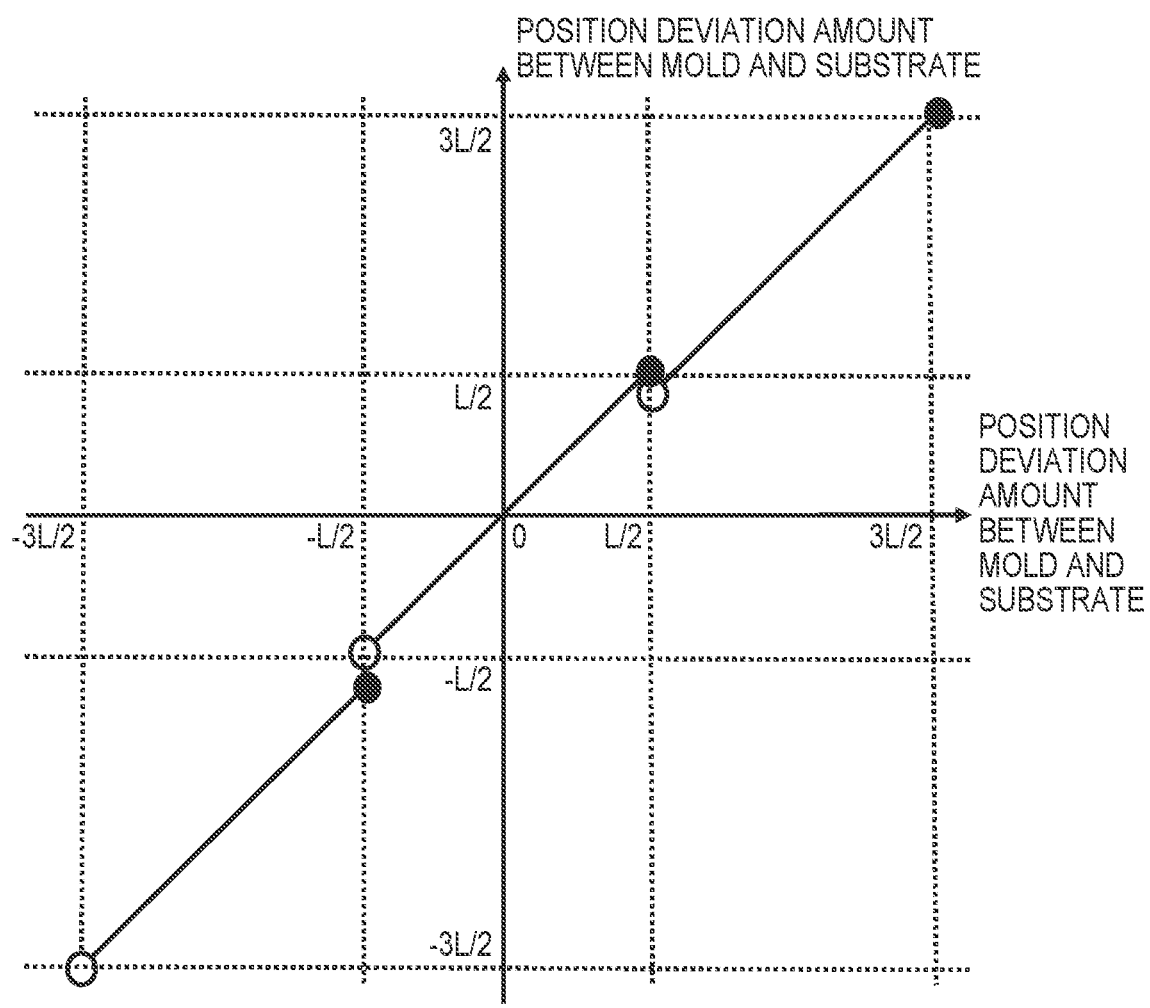

However, when the phases A and B are in the vicinity of +π or −π (the positional deviation between the mold and the substrate is near L/2 or −L/2) as with positions 41 in FIG. 1A, depending on whether or not it is a pitch deviation, the phases A and B may vary by 2π, and the phase measurement value P may also vary by 2π. When the phases A and B vary by 2π, the measurement value D2 of the moiré pattern may also vary by L. At this time, there is no problem if the moiré pattern is an ideal cosine wave, but since there is a manufacturing error in the alignment marks of the mold and the substrate, the moiré pattern is a cosine wave having an asymmetric shape when viewed with an accuracy of several nm. Therefore, as shown in FIG. 9B, for example, when the phase of the moiré patterns at the time of curing is in the vicinity of +π or −π, the result of the alignment between the mold and the substrate varies on the order of several nm depending on whether or not it is a pitch deviation.

Therefore, in the present embodiment, the processor 26 determines a phase shift amount for making the obtained phase measurement value be a value outside of a predetermined range including a discontinuous part of the phase, which produces a pitch deviation. The processor 26, thereafter, performs a phase shift to shift the obtained phase measurement value by the determined phase shift amount, and obtains a relative positioning based on the phase-shifted phase measurement value.

The processor 26, in a case where the phases A and B are in a predetermined range including a discontinuous part of the phase (in the vicinity of the phase of a pitch deviation for phases A and B), for example, adds $\pi$ to the phase A and subtracts $\pi$ from the phase B. As a result, the pitch deviation phase can be shifted by an absolute amount $\pi$.

In the case of a phase shift with respect to phases A and B, phase A': phase A+phase shift amount ($+\pi$), and phase B': phase B+phase shift amount ($-\pi$).

Note that if the phases A' and B' are outside the range $-\pi$ to $+\pi$, $2n\pi$ (n is an integer) is added so that the phases A' and B' fall within the range of $-\pi$ to $+\pi$. Then, the measurement value D2A' of the moiré pattern is calculated from the phase A'. Then, the measurement value D2B' of the moiré pattern is calculated from the phase B'.

Thereafter, in consideration of pulling back half of L (phase $\pi$ shift), the measurement value D2 of the moiré pattern is calculated by the following equation.

$$D2:(D2A'-D2B')/2-L/2$$

Thus, the phase shift amounts are canceled out, and it is possible to obtain the relative positional deviation D2 between the mold 7 and the substrate 8 while also avoiding the risk of pitch deviation. Therefore, since there is a possibility that the phase varies by a as with the position 41 in FIG. 1A, by performing phase shifting and adding L (a phase of $2\pi$), it is possible to make D2 continuous as with the position 42 in FIG. 1B.

Figure 1B:
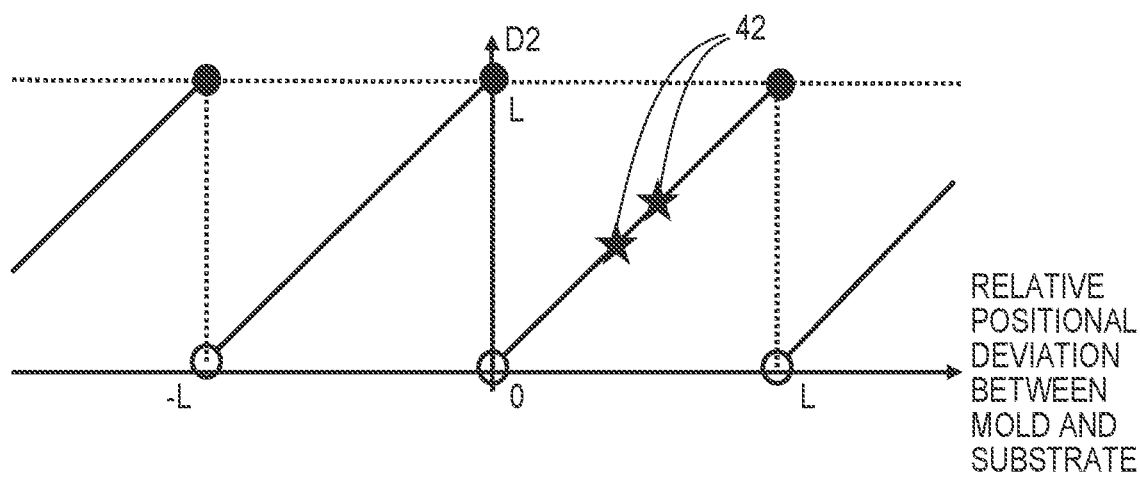

Therefore, $$D2:(D2A'-D2B')/2-L/2+L$$

and relative positional deviation between the mold 7 and the substrate 8: pitch deviation periods×L+D2, and thereby, D2 is made continuous in the vicinity of position 42 of FIG. 1B. Thereby, it is possible to obtain the relative positional deviation between the mold 7 and the shot region of the substrate 8 with high accuracy. Therefore, it is possible to prevent a decrease in the alignment accuracy of the mold and the substrate.

The amount of phase shift may be a value with a maximal margin positive or negative when $\pi$ is shifted from where the phase switches as in the above example, or it can be another value. Incidentally, no phase shift is synonymous to a phase shift with a phase shift amount of 0.

Figure 10A:
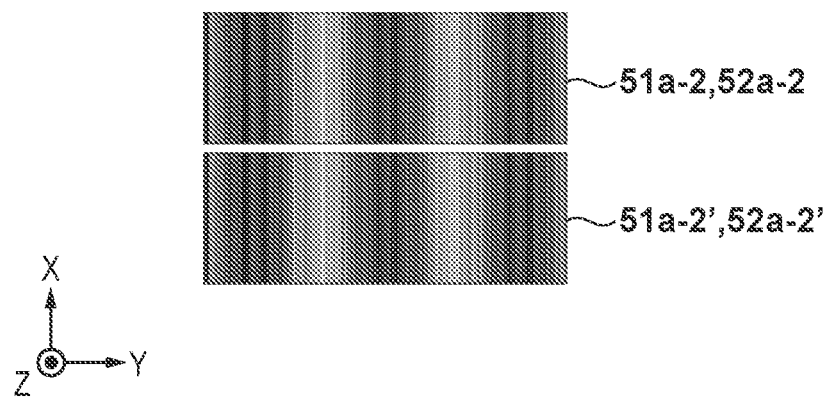
FIGS. 10A and 10B are views for describing a π phase shift due to inversion of light and dark in a moiré.
Figure 10B:
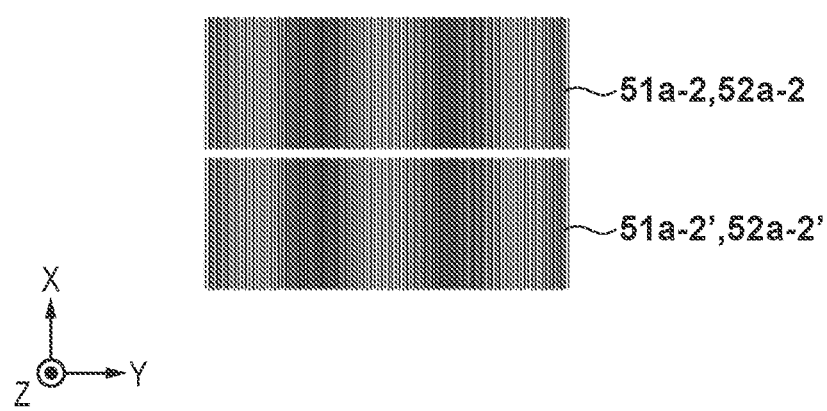
Figure 11A:
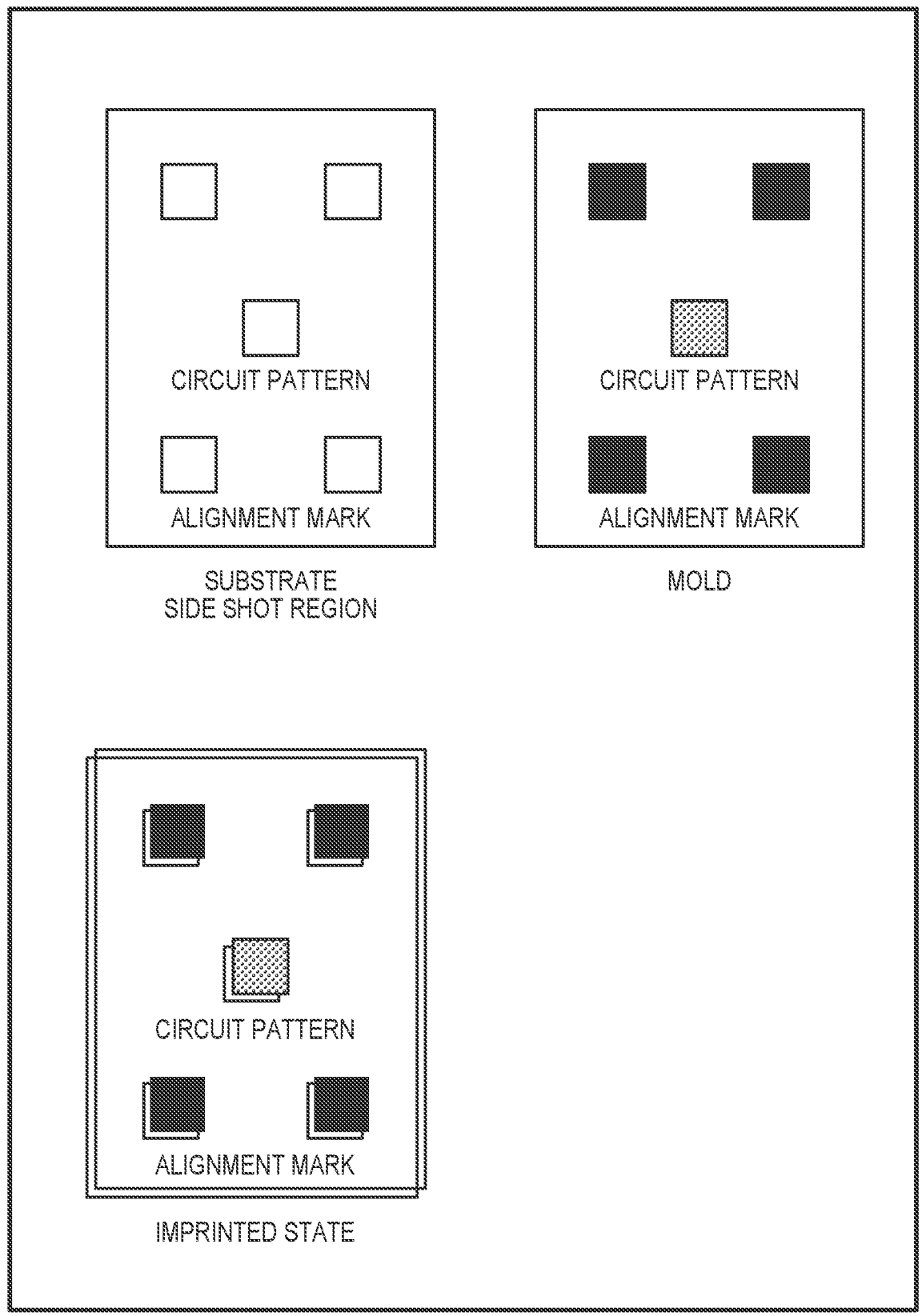
FIGS. 11A and 11B are views illustrating the results of imprinting using a mold in which a circuit pattern and an alignment mark are formed in different layers.
Figure 11B:
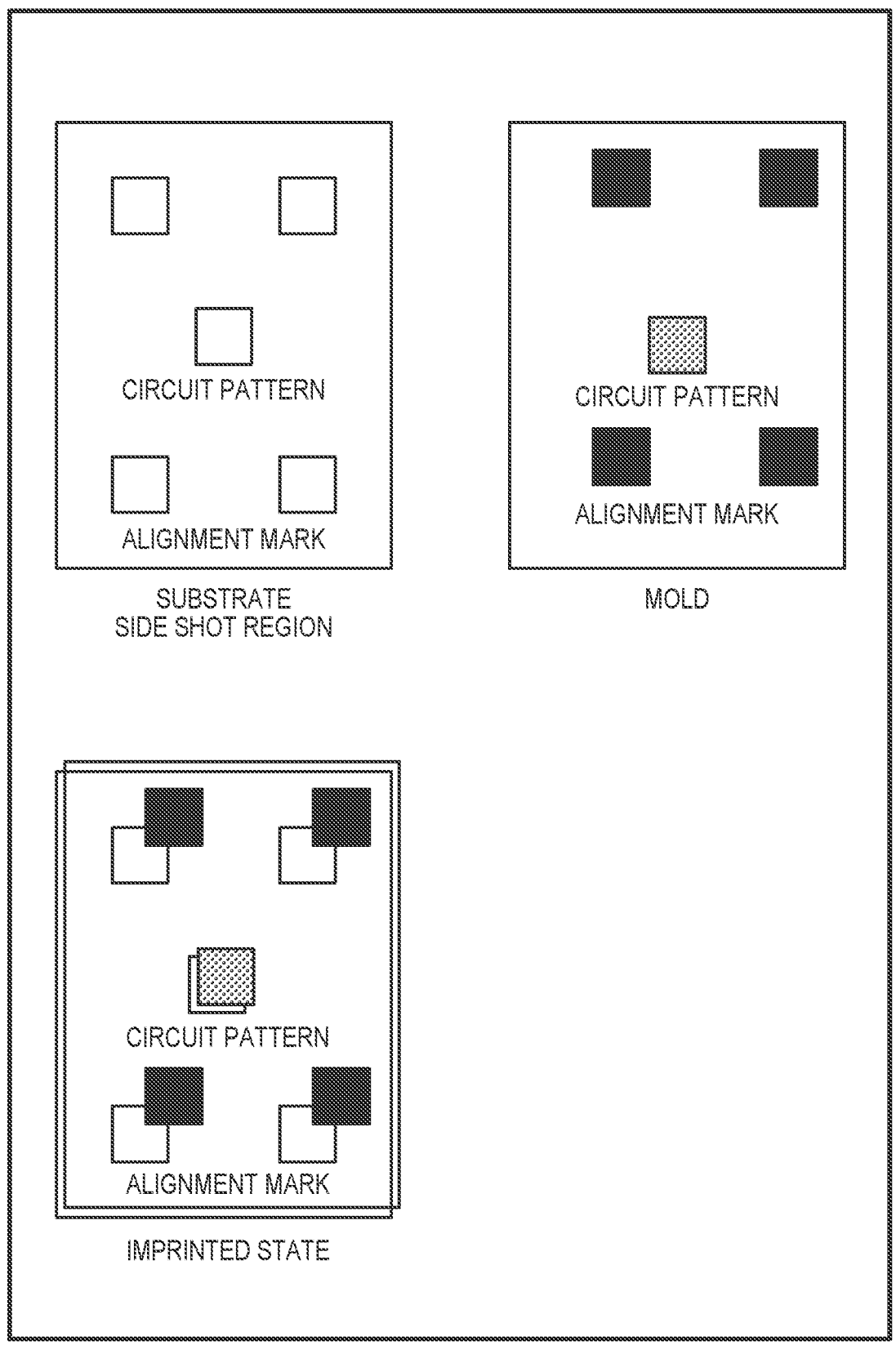

The phases A' and B' may be calculated after reversing the brightness of the moiré patterns in FIG. 10A to convert them into the moiré patterns as shown in FIG. 10B. By inverting light and dark of the moiré in this way, it is possible to realize a phase shift of $\pi$ of the phase measurement value. Thus, it is possible to make the phase continuous even if the positional deviation between the mold 7 and the substrate 8 at the time of curing is in the vicinity of L/2. Therefore, it is possible to prevent a decrease in the alignment accuracy of the mold 7 and the substrate 8 due to pitch deviation.

However, it is necessary to determine whether to shift the phase by $\pi$ with respect to the phases A and B, for example, or whether to invert the brightness of the moiré patterns. In addition, in order to make the determination, it is necessary to ascertain whether the phases A and B at the target position at the time of curing are in the vicinity of the boundary of the pitch deviation.

Figure 15:
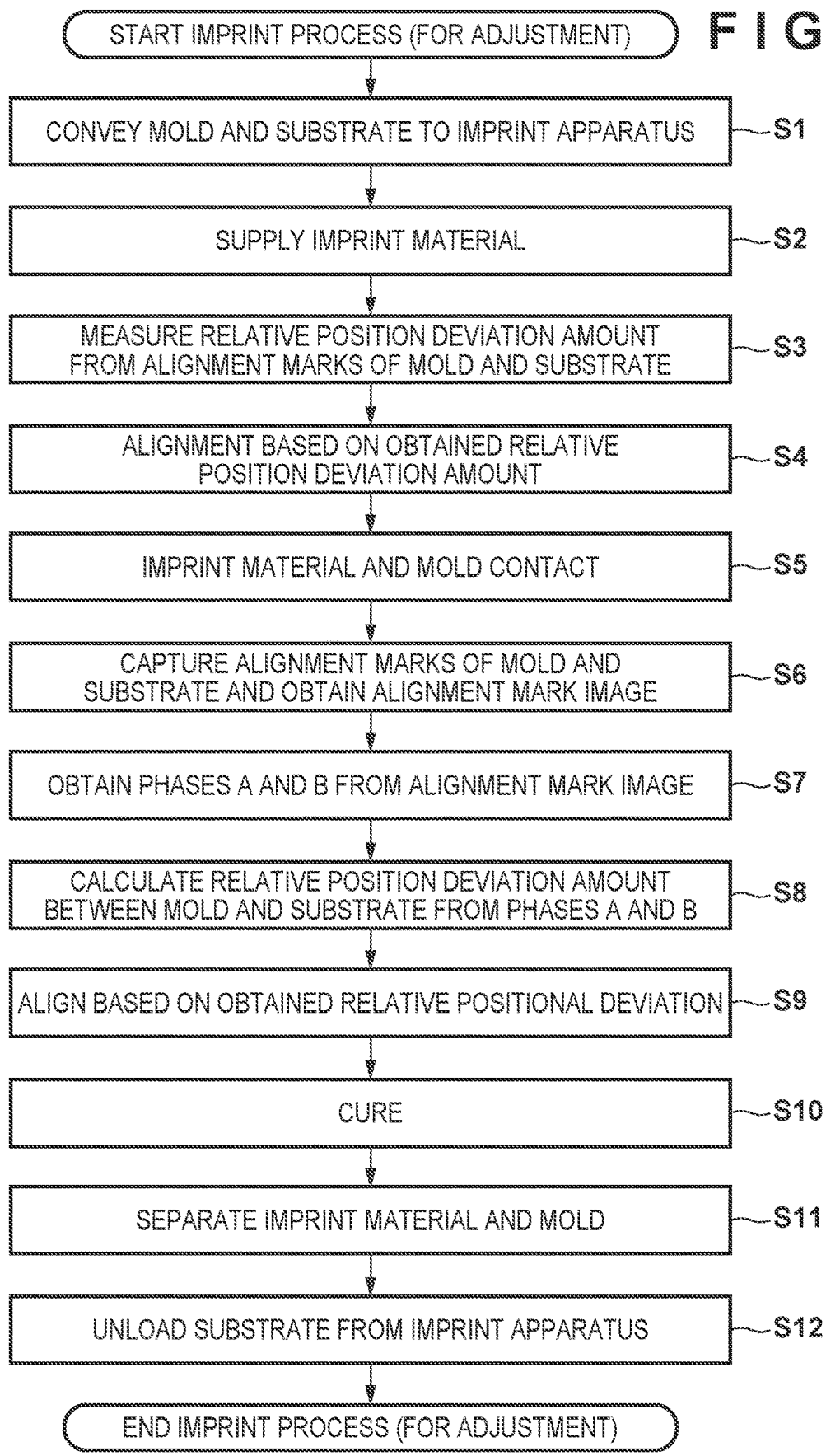
FIG. 15 is a flowchart illustrating a processing procedure performed in an imprint apparatus in a process for obtaining an amount of deviation between a circuit pattern and an alignment mark in a mold.
Figure 16:
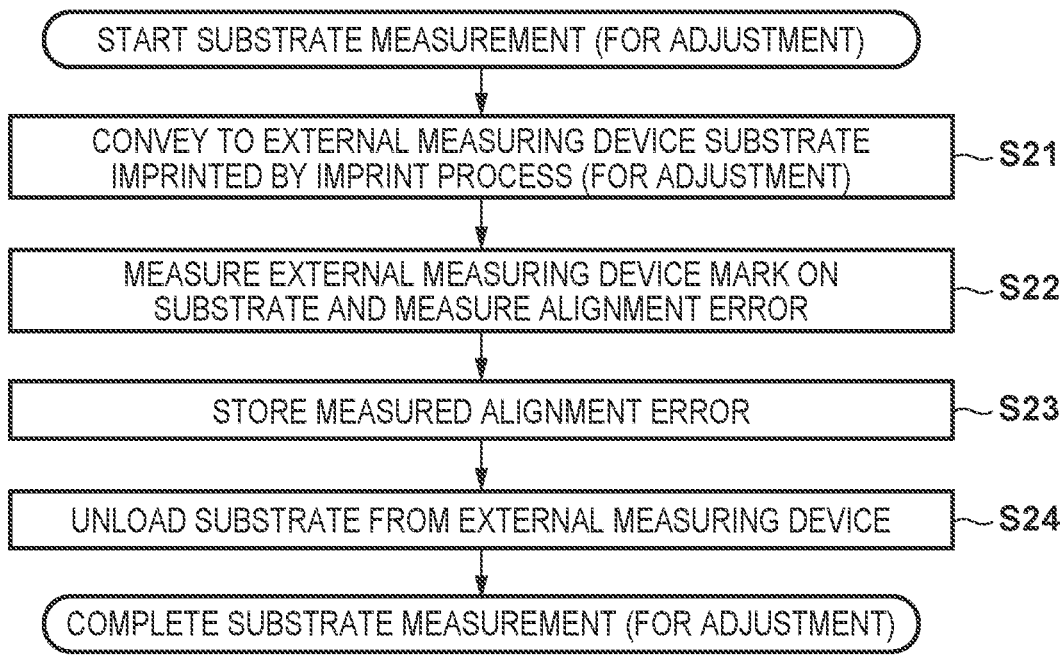
FIG. 16 is a flowchart illustrating a processing procedure performed in an external measurement apparatus in a process for obtaining an amount of deviation between a circuit pattern and an alignment mark in a mold.

Referring to FIG. 15 and FIG. 16, a process of obtaining the amount of deviation between the circuit pattern and the alignment mark in the mold will be described. FIG. 15 is a flowchart of an imprint process for adjustment performed in the imprint apparatus 1 in this procedure, and FIG. 16 is a flowchart of a substrate measurement process for adjustment performed in an external measuring device (not shown) in this procedure.

The procedure of FIG. 15 is executed by the controller 15 in the imprint apparatus 1. In step S1, the controller 15 controls a mold conveyance mechanism (not shown) and the substrate conveyance mechanism (not shown) so that the mold 7 and the substrate 8 are conveyed into the imprint apparatus 1. In step S2, the controller 15 controls the substrate driving mechanism 5 and the dispenser 6 to supply (arrange) the imprint material onto the shot region of the substrate 8.

In step S3, the controller 15 (processor 26) obtains an image by imaging the substrate-side mark 11 of the substrate 8 and the mold-side mark 10 of the mold 7 (the shot region) by the image capturing element 25. The controller 15 (processor 26) processes the acquired image, and obtains the relative position deviation amount of the alignment marks of the mold 7 and the substrate 8 (coarse position detection). For this relative position deviation amount, using a plurality of positional information detected by the detection device 3, not only XY deviation, but also rotational deviation, magnificational deviation, and other high-order component deviation may be calculated.

In step S4, the controller 15 controls a driving mechanism (at least one of the mold driving mechanism and the substrate driving mechanism 5) so that alignment of the mold 7 and the shot region of the substrate 8 is performed based on the relative position deviation amount obtained in step S3. In step 5, the controller 15 controls the drive mechanism so that the imprint material and the mold 7 on the shot region of the substrate 8 are in contact (rough alignment).

In step S6, the controller 15 (processor 26), in a state where the mold 7 and the imprint material on the substrate 8 are in contact, images the substrate-side alignment mark 11 of the shot region of the substrate 8 and the mold-side alignment mark 10 of the mold 7 by the image capturing element 25. In step S7, the processor 26 performs processing such as a discrete Fourier transform on the image obtained by imaging (alignment mark image), as in FIG. 8, and obtains the phases A and B of the two moiré patterns.

In step S8, the processor 26, first, obtains a measurement value D2 of the moiré patterns from the phases A and B. Since step S4 has already aligned the mold and substrate to a state in which the deviation of the substrate-side alignment mark 11 of the substrate 8 from the mold-side alignment mark 10 of the mold 7 is small, usually a pitch deviation does not occur at the time of step S8. Therefore, the moiré pattern measurement value D2 is the relative position deviation amount between the mold and the substrate. However, it is also possible that the mold deviates during contact. Therefore, the processor 26 makes a determination as to how many periods the pitch deviation is, based on a value obtained by converting the relative positional deviation D1 of the mold-side mark 51a-1 and the substrate-side mark 52a-1 to the apparatus coordinate system and the length L. Thereafter, the processor 26, by calculating the pitch deviation periods×L+D2, obtains the relative positional deviation between the mold 7 and the substrate 8. In steps S6 to S8, the relative positional deviation between the mold 7 and the substrate 8 can be calculated by a process equivalent to the process step S106 to step S112 described later.

In step S9, the controller 15, based on the relative positional deviation obtained in step S8, controls the drive mechanism so that the alignment of the mold 7 and the substrate 8 is performed (fine alignment). At this time, it is desirable that the alignment is performed so that the relative positional deviation of the mold 7 and the substrate 8 is 0.

In step S10, the controller 15 controls the curing device 2 to cure the imprint material. In step S11, the drive mechanism is controlled so that the imprint material and the mold 7 are separated from each other. In step S12, the controller 15 controls the substrate conveyance mechanism so that the substrate 8 is unloaded from the imprint apparatus 1.

Although the above procedure illustrates a procedure for one shot region, step S1 to step S11 may be repeatedly performed for each of a plurality of shot regions.

Next, the procedure of FIG. 16 (substrate measurement process (for adjustment)) is executed. In step S21, the substrate 8 processed according to the procedure of FIG. 15 is conveyed to an external measuring device. In step S22, the external measuring device measures the external measuring device mark on the substrate 8 and calculates the alignment error. The alignment error may be, for example, an average of the alignment errors of each of a plurality of shot regions on the substrate 8. In step S23, the controller 15 of the imprint apparatus 1 acquires the alignment error obtained in step S22 and stores the alignment error in memory as a drawing error E of the mold 7 which is a deviation amount between the circuit pattern in the mold 7 and the alignment mark. In step S24, the substrate 8 is unloaded from the external measuring device. Through the above processing, the drawing error E between the pattern of the mold 7 and the mold-side mark 10 is obtained in advance.

Figure 17A:
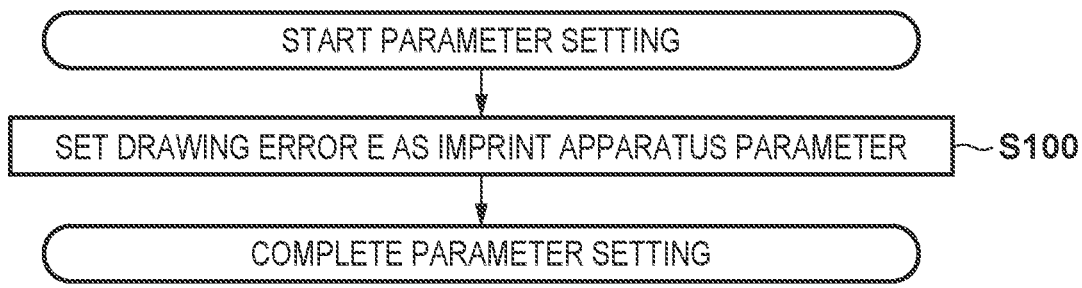
FIGS. 17A and 17B are flowcharts illustrating a process for setting an imprint apparatus parameter.

FIG. 17A illustrates a view for describing a process for setting an imprint apparatus parameter. In step S100, the controller 15 (the processor 26) sets, as the drawing error E, the alignment error read from the memory to a semiconductor manufacturing imprint apparatus parameter.

Figure 18:
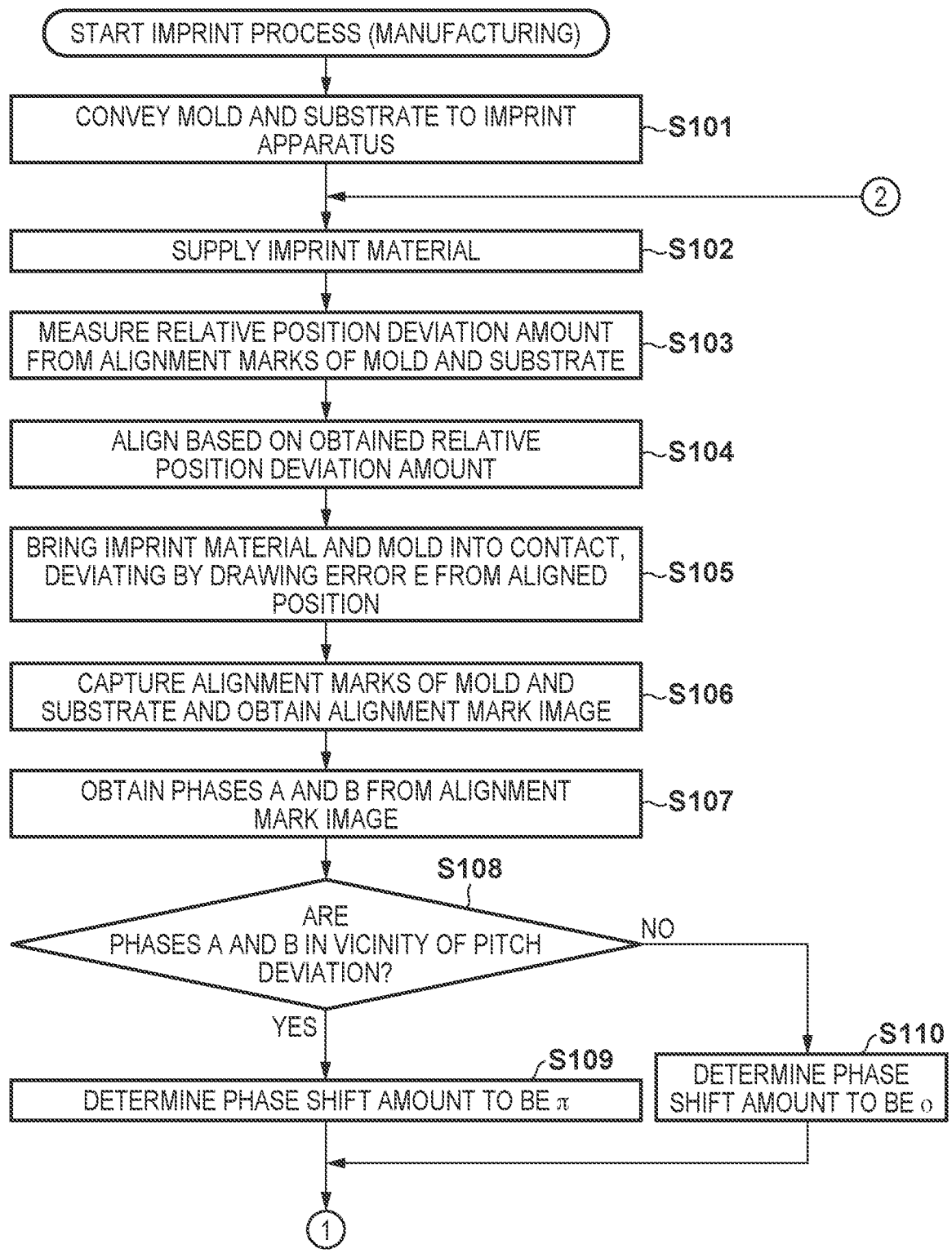
FIG. 18 is a flowchart illustrating an imprint process performed when manufacturing a semiconductor.
Figure 19:
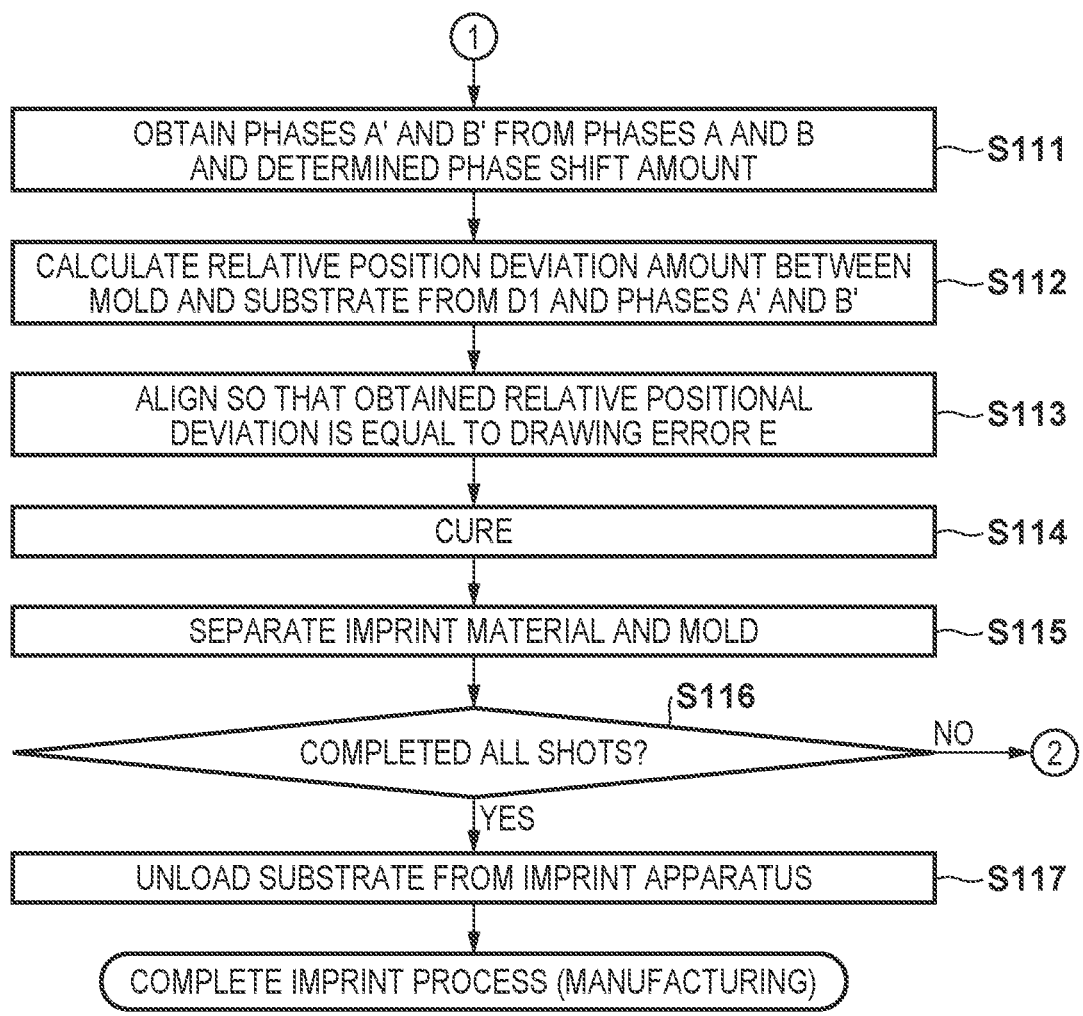
FIG. 19 is a flowchart illustrating an imprint process performed when manufacturing a semiconductor.

In FIG. 18 and FIG. 19, a procedure of the imprint process at the time of semiconductor manufacturing by the imprint apparatus 1 is exemplified. In step S101, the controller 15 controls the mold conveyance mechanism (not shown) and the substrate conveyance mechanism (not shown) so that the mold 7 and the substrate 8 are conveyed into the imprint apparatus 1. In step S102, the controller 15 controls the substrate driving mechanism 5 and the dispenser 6 to supply (arrange) the imprint material onto the shot region of the substrate 8.

In step S103, the controller 15 (processor 26) obtains an alignment mark image by capturing an image of the mold-side mark 10 of the mold 7 and the substrate-side mark 11 of the substrate 8 (the shot region) by the image capturing element 25. The controller 15 (processor 26) processes the acquired alignment mark image, and obtains the relative position deviation amount of the alignment marks of the mold 7 and the substrate 8 (coarse position detection). For this relative position deviation amount, it is possible to calculate not only XY deviation, but also rotational deviation, magnificational deviation, and other high-order component deviation, using a plurality of positional information detected by the detection device 3.

In step S104, the controller 15 controls (rough alignment) a driving mechanism (at least one of the mold driving mechanism and the substrate driving mechanism 5) so that alignment of the mold 7 and the shot region of the substrate 8 is performed based on the relative position deviation amount obtained in step S103.

In step S105, the controller 15 controls the driving mechanism so that the relative positioning of the mold 7 and the shot region is shifted (corrected) in accordance with the drawing error E set as the imprint apparatus parameter from a state of being aligned in step S103. Thereafter, the controller 15 controls the drive mechanism so that the imprint material and the mold 7 on the shot region of the substrate 8 are in contact.

In step S106, the controller 15 (processor 26), in a state where the mold 7 and the imprint material on the substrate 8 are in contact, captures an image of the substrate-side alignment mark 11 of the shot region of the substrate 8 and the mold-side alignment mark 10 of the mold 7 by using the image capturing element 25. In step S107, the processor 26 performs processing such as a discrete Fourier transform on the image (alignment mark image) obtained by image capturing, and obtains the phases A and B (phase measurement values) of the two moiré patterns.

In step S108, the processor 26 determines whether the phases A and B obtained in step S106 are respectively in a vicinity (a predetermined range including a discontinuous part of a phase) of a pitch deviation $\pi+2n\pi$ (n is an integer). If the phases A and B are in a vicinity of a pitch deviation, the process proceeds to step S109; otherwise, the process proceeds to step S110.

In step S109, the processor 26 determines the phase shift amount to be, for example, $\pi$. In step S110, since the phases A and B are not in a vicinity of a pitch deviation, the processor 26 determines the phase shift amount to 0. In step S108, step S109, and step S110, the difference between the target phase and the phases A and B may be calculated as the phase shift amount.

In step S111, the processor 26 obtains the phases A' and B' using the phases A and B and the determined phase shift amount. For example, when the phase shift amount is determined to be $\pi$, the processor 26 calculates the phase A+$\pi$ and the phase B−$\pi$. If the calculation result does not fall within the range of −$\pi$ to +$\pi$, −$2n\pi$ (n is an integer) is further added to fall within the range of −$\pi$ to +$\pi$. The results obtained by such an operation are referred to as phases A' and B'.

In step S109 and step S111, if the phases A and B are in a vicinity of a pitch deviation, the phases A' and B' may be obtained by performing a discrete Fourier transform after inverting the light and dark of the moiré patterns as shown in FIG. 10. When the brightness of the moiré patterns is reversed, the phase shift amount is $\pi$.

In step S112, the processor 26, first, calculates a measurement value D2 of moiré patterns from the phases A' and B'. Next, the processor 26 makes a determination as to how many periods the pitch deviation is, based on a value obtained by converting the relative positional deviation D1 of the mold-side mark 51a-1 and the substrate-side mark 52a-1 to the apparatus coordinate system and based on the length L. Thereafter, the processor 26 calculates the pitch deviation periods×L+D2, and adds the phase shift amount×L to the calculation result, and thereby calculates the relative position deviation amount between the mold 7 and the substrate 8.

In step S113, the controller 15 controls the driving mechanism to perform alignment (fine alignment) so that the relative position deviation amount between the mold 7 and the substrate 8 obtained in step S112 is equal to the drawing error E. By this alignment, it is possible to align the circuit pattern of the mold 7 and the circuit pattern of the substrate 8 with high accuracy.

In step S114, the controller 15 controls the curing device 2 to cure the imprint material. In step S115, the drive mechanism is controlled so that the imprint material and the substrate 8 are separated. In step S116, the controller 15 determines whether or not the imprint process has been completed for all the shot regions. If the imprint processing has not been completed for all the shot regions, the processing returns to step S102, and the imprint processing for the subsequent shot region is performed. When the imprint processing for all the shot regions is completed, the processing proceeds to step S117. In step S117, the controller 15 controls the substrate conveyance mechanism so that the substrate 8 is unloaded from the imprint apparatus 1.

(Modifications)

Figure 17B:
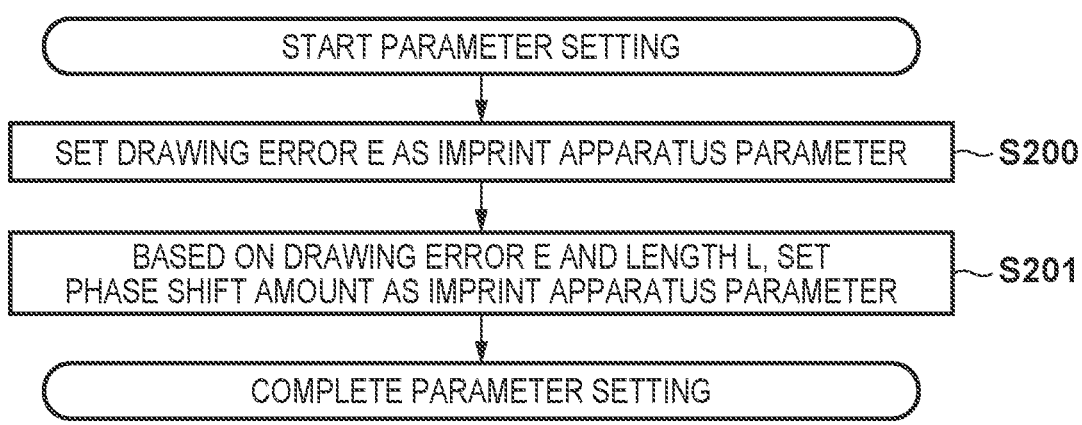

FIG. 17B illustrates a view for describing a process for setting an imprint apparatus parameter according to a modification. In step S200, the controller 15 (the processor 26) sets, as the drawing error E, the alignment error read from the memory to the semiconductor manufacturing imprint apparatus parameter. Next, in step S201, the processor 26 sets the phase shift amount as an imprint apparatus parameter, based on the drawing error E and the length L. For example, the phase of the drawing error is defined as (drawing error $E$/length $L$)*$2\pi$.

Then, the processor 26 confirms whether or not the phase of the drawing error E is in the vicinity of a pitch deviation $\pi+2n\pi$ (n is an integer) (a predetermined range including a discontinuous part of a phase). Then, if the phase of the drawing error E is in the vicinity of a pitch deviation, $+\pi$, for example, is determined as the phase shift amount. If the phase of the drawing error E is not in a vicinity where the pitch deviates, the processor 26 determines the phase shift amount to be 0. Here, the difference between the target phase and phase of the drawing error E may be calculated as the phase shift amount. The processor 26 sets the phase shift amount thus obtained as the imprint apparatus parameter.

Figure 20:
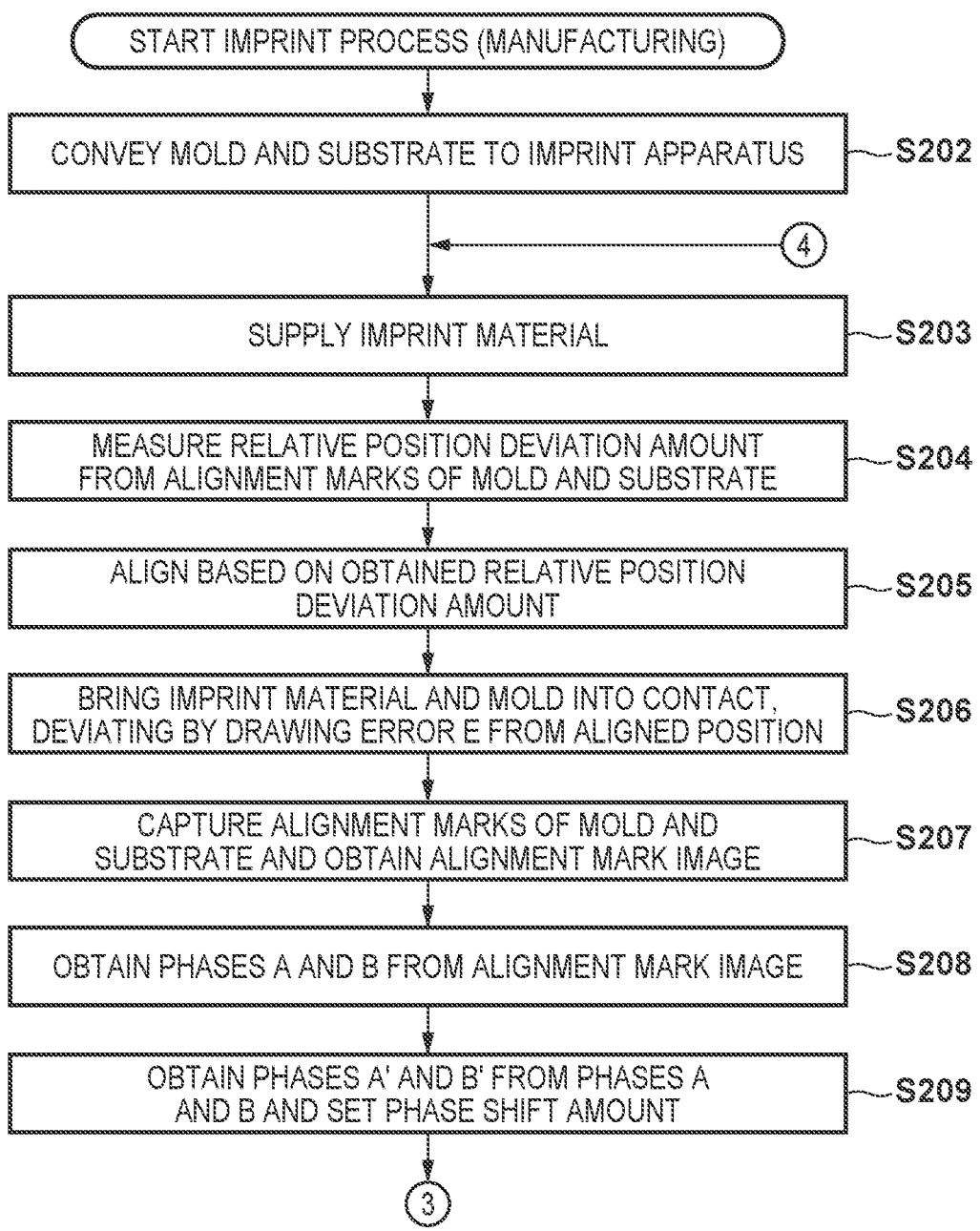
FIG. 20 is a flowchart illustrating an imprint process performed when manufacturing a semiconductor.
Figure 21:
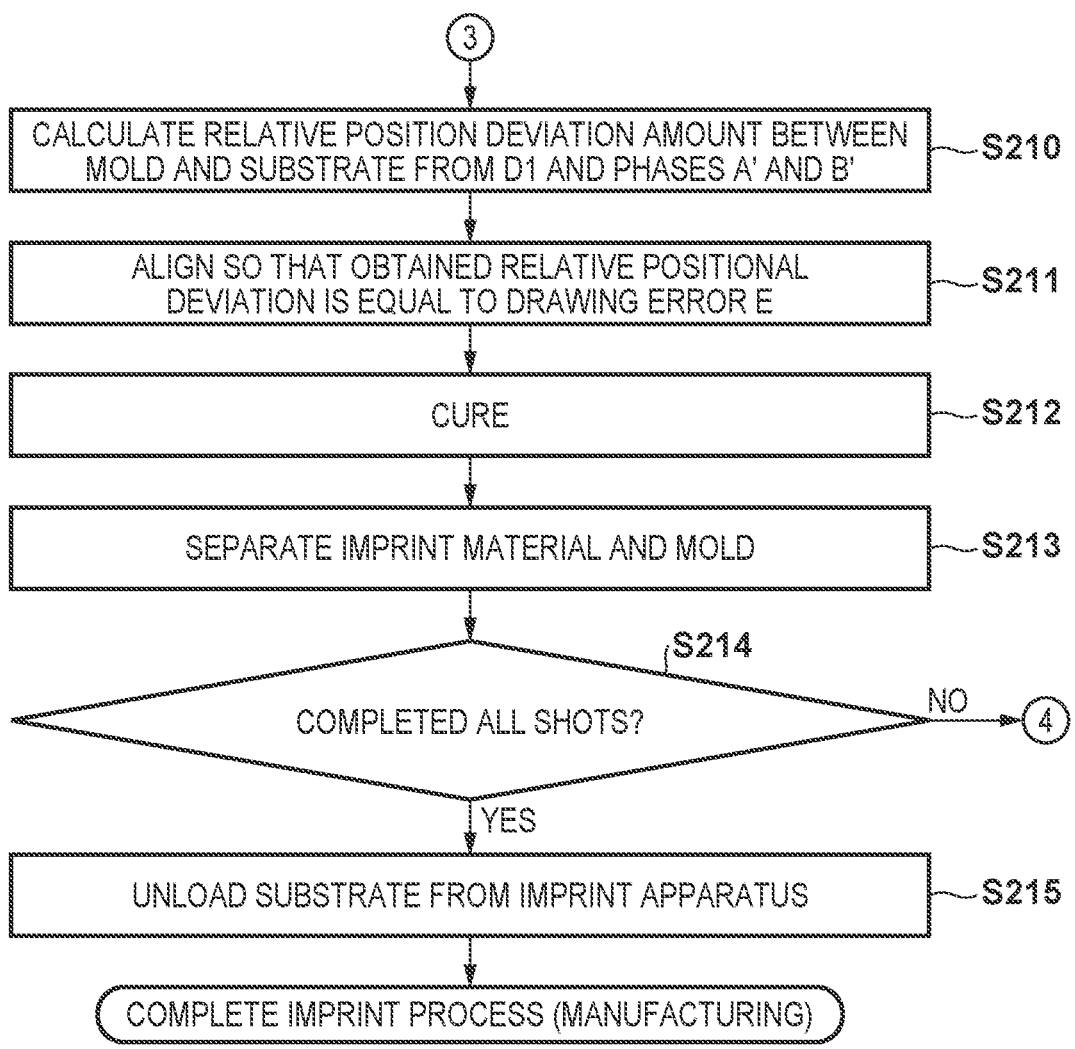
FIG. 21 is a flowchart illustrating an imprint process performed when manufacturing a semiconductor.

In FIG. 20 and FIG. 21, the procedure, according to the modification, of the imprint process at the time of semiconductor manufacture by the imprint apparatus 1 is exemplified. In step S202, the controller 15 controls the mold conveyance mechanism (not shown) and the substrate conveyance mechanism (not shown) so that the mold 7 and the substrate 8 are conveyed to the imprint apparatus 1. In step S203, the controller 15 controls the substrate driving mechanism 5 and the dispenser 6 to arrange the imprint material onto the shot region of the substrate 8.

In step S204, the controller 15 (processor 26) obtains an alignment mark image by capturing an image of the substrate-side mark 11 of the substrate 8 and the mold-side mark 10 of the mold 7 (the shot region) by the image capturing element 25. The controller 15 (processor 26) processes the acquired alignment mark image, obtains the relative position deviation amount of the alignment marks of the mold 7 and the substrate 8 (coarse position detection). For this relative position deviation amount, it is possible to calculate not only XY deviation, but also rotation deviation, magnificational deviation, and other high-order component deviation, using a plurality of positional information detected by the detection device 3.

In step S205, the controller 15 controls (rough alignment) a driving mechanism (at least one of the mold driving mechanism and the substrate driving mechanism 5) so that alignment of the mold 7 and the shot region of the substrate 8 is performed based on the relative position deviation amount obtained in step S204.

In step S206, the controller 15 controls the driving mechanism so that the relative positioning of the mold 7 and the shot region deviates in accordance with the drawing error E set as the imprint apparatus parameter from a state of being aligned in step S205. Thereafter, the controller 15 controls the drive mechanism so that the imprint material and the mold 7 on the shot region of the substrate 8 are in contact.

In step S207, the controller 15 (processor 26), in a state where the mold 7 and the imprint material on the substrate 8 are in contact, captures an image of the substrate-side alignment mark 11 of the shot region of the substrate 8 and the mold-side alignment mark 10 of the mold 7 by using the image capturing element 25. In step S208, the processor 26 performs processing such as a discrete Fourier transform on the image (alignment mark image) obtained by image capturing, and obtains the phases A and B of the two moiré patterns.

In step S209, the processor 26 obtains the phases A' and B' using the phases A and B obtained in step S208 and the phase shift amount set in step S201. For example, when the phase shift amount is set to be $\pi$, the processor 26 calculates the phase A+$\pi$ and the phase B−$\pi$. If the calculation result does not fall within the range of −$\pi$ to +$\pi$, −$2n\pi$ (n is an integer) is further added to fall within the range of −$\pi$ to +$\pi$. The results obtained by such an operation are referred to as phases A' and B'. In step S208 and step S209, if the phase shift amount set in step S201 is $\pi$, the phases A' and B' may be obtained by performing a discrete Fourier transform after inverting the light and dark of the moiré patterns.

In step S210, the processor 26, first, calculates a measurement value D2 of moiré patterns from the phases A' and B'. Next, the processor 26 makes a determination as to how many periods the pitch deviation is, based on a value obtained by converting the relative positional deviation D1 of the mold-side mark 51a-1 and the substrate-side mark 52a-1 to the apparatus coordinate system and based on the length L. Thereafter, the processor 26 calculates the pitch deviation periods×L+D2, and adds the phase shift amount×L to the calculation result, and thereby calculates the relative position deviation amount between the mold 7 and the substrate 8.

In step S211, the controller 15 controls the driving mechanism to perform alignment (fine alignment) so that the relative position deviation amount between the mold 7 and the substrate 8 obtained in step S210 is equal to the drawing error E. By this alignment, it is possible to align the circuit pattern of the mold 7 and the circuit pattern of the substrate 8 with high accuracy.

In step S212, the controller 115 controls the curing device 2 to cure the imprint material. In step S213, the drive mechanism is controlled so that the imprint material and the mold 7 are separated. In step S214, the controller 15 determines whether or not the imprint process has been completed for all the shot regions. If the imprint processing has not been completed for all the shot regions, the processing returns to step S203, and the imprint processing for the subsequent shot region is performed. When the imprint processing for all the shot regions is completed, the processing proceeds to step S215. In step S215, the controller 15 controls the substrate conveyance mechanism so that the substrate 8 is unloaded from the imprint apparatus 1.

Incidentally, regarding step S2 of FIG. 15, step S102 of FIG. 18, and step S203 of FIG. 20, imprint material may be supplied to the substrate prior to conveying the substrate into the imprint apparatus 1. In addition, in the above-described embodiment, the calculation processing using the phase shift is only an example, and modifications that invert the sign or change the order of calculations are within the scope of the present invention where the results are the same.

<Embodiment of Article Manufacturing Method>

A pattern of cured products formed using an imprint apparatus is used either permanently on at least a portion of the respective article or is used temporarily when manufacturing the respective article. The article may be an electric circuit element, an optical element, a MEMS, a recording element, a sensor, a mold, or the like. The article, as an electric circuit element, may be a volatile or non-volatile semiconductor memory such as DRAM, SRAM, a flash memory, MRAM, and a semiconductor element such as an LSI, a CCD, an image sensor, an FPGA, and the like. The article, as a mold, may be an imprint mold or the like.

The pattern of the cured product may be used as is as a constituent member of at least a part of the above article or may be temporarily used as a resist mask. After etching, ion implantation, or the like is performed in a substrate processing step, the resist mask is removed.

Next, an article manufacturing method will be described. In a step SA of FIG. 12, a substrate 1z, such as a silicon substrate, on the surface of which a work material 2z, such as an insulator, is formed is prepared, and then, by an ink jet method or the like, an imprint material 3z is imparted onto the surface of the work material 2z. Here, a state in which a plurality of imprint materials 3z in the form of droplets are applied onto a substrate is shown.

Figure 12:
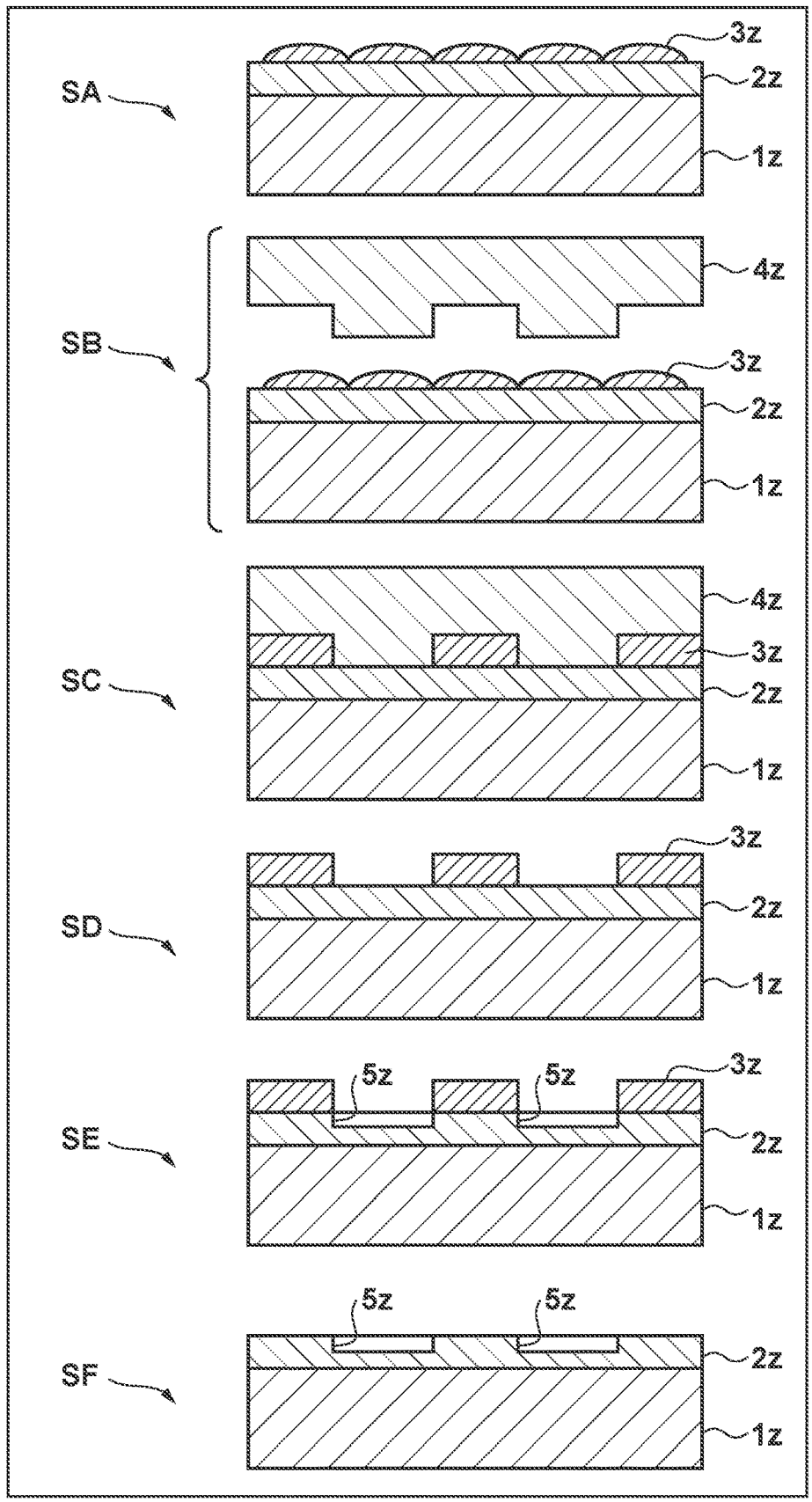
FIG. 12 is a view for describing an article manufacturing method.

In step SB of FIG. 12, the side of the mold 4z for imprinting, on which the concave/convex pattern is formed opposes the imprint material 3z on the substrate. In step SC of FIG. 12, the substrate 1z to which the imprint material 3z is applied is brought into contact with the mold 4z, and pressure is applied. The gap between the mold 4z and the processed material 2z is filled with the imprint material 3z. In this state, when the imprint material 3z is irradiated with light as energy for curing via the mold 4z, the imprint material 3z is cured.

In step SD in FIG. 12, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product; that is, the pattern having concave/convex patterns of the mold 4z is transferred to the imprint material 3z.

In step SE in FIG. 12, when etching is performed using the pattern of the cured product as an etching resistant mask, a portion of the surface of the processed material 2z where the cured product does not exist or remains thin is removed to form a groove 5z. In the step SF of FIG. 12, when the pattern of the cured product is removed, an article in which the groove 5z is formed on the surface of the work material 2z can be obtained. Here, the pattern of the cured product is removed; however, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-123566, filed Jul. 28, 2021, which is hereby incorporated by reference herein in its entirety.

What is claimed is:

1. A position detection apparatus comprising:
a processor configured to:
obtain an image of a moiré that occurs due to a first diffraction grating having a grating pattern arranged in a first direction and a second diffraction grating having a grating pattern arranged in the first direction at a different pitch to the first diffraction grating overlapping;
perform a periodic analysis of a luminance distribution of the obtained image of the moiré;
based on a result of the periodic analysis, obtain a phase measurement value of the luminance distribution;
based on the obtained phase measurement value, obtain a relative positioning between the first diffraction grating and the second diffraction grating;
determine a phase shift amount for making the obtained phase measurement value fall outside of a predetermined range including a discontinuous part of the phase; and
perform a phase shift to shift the obtained phase measurement value by the determined phase shift amount; and
obtain the relative positioning based on the phase-shifted phase measurement value,
wherein the phase shift is performed by:
adding the determined phase shift amount to the obtained phase measurement value; or
subtracting the determined phase shift amount from the obtained phase measurement value.

2. The position detection apparatus according to claim 1, wherein the processor is configured to:
in a state where the obtained phase measurement value is within the predetermined range, determine the phase shift amount to be $\pi$; and
in a state where the obtained phase measurement value is outside of the predetermined range, determine the phase shift amount to be 0.

3. The position detection apparatus according to claim 2, wherein the processor is configured to, in a state where the determined phase shift amount is $\pi$, realize a $\pi$ phase shift of the obtained phase measurement value by inverting light and dark in the moiré.

4. An imprint apparatus for forming a pattern on a substrate by bringing a pattern region of a mold and an imprint material on the substrate into contact, the imprint apparatus comprising:
a position detection apparatus configured to detect a relative positioning between the mold and the substrate based on an image obtained by capturing a mold-side mark disposed on the mold and a substrate-side mark disposed on the substrate;
a controller configured to, based on a result of detection by the position detection apparatus, control a position of at least one of the mold or the substrate,
wherein the mold-side mark includes a first diffraction grating including a first grating pattern arranged in a first direction, and the substrate-side mark includes a second diffraction grating including a second grating pattern arranged in the first direction at a different pitch to the first diffraction grating, and
wherein the position detection apparatus comprises a processor configured to:

detect, from the image, an image of a moiré occurring due to the first diffraction grating and the second diffraction grating overlapping;

perform a periodic analysis of the detected image of the moiré;

obtain a phase measurement value of a luminance distribution based on a result of the periodic analysis;

obtain the relative position based on the obtained phase measurement value of the luminance distribution;

determine a phase shift amount for making the obtained phase measurement value to fall outside of a predetermined range including a discontinuous part of a phase;

perform a phase shift to shift the obtained phase measurement value by the determined phase shift amount; and obtain a relative positioning based on the phase-shifted phase measurement value, wherein the phase shift is performed by:
adding the determined phase shift amount to the obtained phase measurement value; or
subtracting the determined phase shift amount from the obtained phase measurement value.

5. The imprint apparatus according to claim 4, wherein the processor is configured to determine the phase shift amount to be:

π in a state where the obtained phase measurement value is within the predetermined range; and 0 in a state where the obtained phase measurement value is outside of the predetermined range.

6. The imprint apparatus according to claim 5, wherein the processor is configured to realize a π phase shift of the obtained phase measurement value by inverting light and dark of the moiré in a state where the determined phase shift amount is π.

7. The imprint apparatus according to claim 4, wherein:
the mold-side mark further includes a first mark for a rough alignment, and the substrate-side mark further includes a second mark for the rough alignment, and
the processor is configured to perform detection of a rough positioning between the mold and the substrate based on an image of the first mark and an image of the second mark in the image, and
the controller is configured to:
perform a rough alignment of the mold and the substrate based on a result of the rough positioning detection; and
after the rough alignment, perform a fine alignment between the mold and the substrate based on the relative positioning obtained based on the phase-shifted phase measurement value.

8. The imprint apparatus according to claim 7, wherein:
the controller is configured to, after the rough alignment, correct a relative positioning between the mold and the substrate in accordance with a drawing error obtained in advance between the pattern of the mold and the mold-side mark, and thereafter, bring the pattern region of the mold into contact with the imprint material on the substrate, and
the position detection apparatus is configured to perform image capturing of the mold-side mark and the substrate-side mark in a state where the pattern region of the mold and the imprint material on the substrate are in contact.

9. The imprint apparatus according to claim 8, wherein the controller is configured to perform the fine alignment so that the relative positioning obtained by the processor based on the phase-shifted phase measurement value becomes equal to the drawing error.

10. The imprint apparatus according to claim 4, wherein:
the mold-side mark further comprises a third diffraction grating having a grating pattern arranged in the first direction at the same pitch as the second diffraction grating,
the substrate-side mark further comprises a fourth diffraction grating having a grating pattern arranged in the first direction at the same pitch as the first diffraction grating, and
the processor is configured to:
detect, in the image, an image of a first moiré occurring due to the first diffraction grating and the second diffraction grating overlapping and an image of a second moiré occurring due to the third diffraction grating and the fourth diffraction grating overlapping;
obtain a first phase measurement value of a luminance distribution of the first moiré and a second phase measurement value of a luminance distribution of the second moiré; and
obtain the phase measurement value based on a difference between the first phase measurement value and the second phase measurement value.

11. The imprint apparatus according to claim 10, wherein the processor adds the determined phase shift amount to the first phase measurement value, and subtracts the determined phase shift amount from the second phase measurement value to perform the phase shift.

12. An article manufacturing method comprising:
forming a pattern on a substrate with an imprint apparatus;
performing processing on the substrate on which the pattern is formed; and
manufacturing an article from the substrate on which the processing has been performed,
wherein the imprint apparatus forms the pattern on the substrate by bringing a pattern region of a mold and an imprint material on the substrate into contact, the imprint apparatus comprising:
a position detection apparatus configured to detect a relative positioning between the mold and the substrate based on an image obtained by capturing a mold-side mark disposed on the mold and a substrate-side mark disposed on the substrate;
a controller configured to, based on a result of detection by the position detection apparatus, control a position of at least one of the mold or the substrate,
wherein the mold-side mark includes a first diffraction grating including a first grating pattern arranged in a first direction, and the substrate-side mark includes a second diffraction grating including a second grating pattern arranged in the first direction at a different pitch to the first diffraction grating, and
wherein the position detection apparatus comprises a processor configured to:
detect, from the image, an image of a moiré occurring due to the first diffraction grating and the second diffraction grating overlapping;
perform a periodic analysis of the detected image of the moiré;
obtain a phase measurement value of a luminance distribution based on a result of the periodic analysis;

obtain the relative position based on the obtained phase measurement value of the luminance distribution;

determine a phase shift amount for making the obtained phase measurement value to fall outside of a predetermined range including a discontinuous part of a phase;

perform a phase shift to shift the obtained phase measurement value by the determined phase shift amount; and obtain a relative positioning based on the phase-shifted phase measurement value, wherein the phase shift is performed by:
adding the determined phase shift amount to the obtained phase measurement value; or
subtracting the determined phase shift amount from the obtained phase measurement value.

* * * * *